United States Patent
Roesner et al.

(10) Patent No.: US 7,092,864 B2
(45) Date of Patent: Aug. 15, 2006

(54) SIGNAL OVERRIDE FOR SIMULATION MODELS

(75) Inventors: Wolfgang Roesner, Austin, TX (US); Derek Edward Williams, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 807 days.

(21) Appl. No.: 09/751,803

(22) Filed: Dec. 29, 2000

(65) Prior Publication Data

US 2002/0123873 A1    Sep. 5, 2002

(51) Int. Cl.
*G06G 17/50* (2006.01)
*G06F 19/00* (2006.01)
*G06F 9/44* (2006.01)

(52) U.S. Cl. ............... 703/14; 716/4; 703/13; 700/182

(58) Field of Classification Search .......... 703/14; 716/4

See application file for complete search history.

(56) References Cited

U.S. PATENT DOCUMENTS

| | | | | |
|---|---|---|---|---|
| 5,103,450 A | * | 4/1992 | Whetsel ..................... 714/724 |
| 5,544,067 A | * | 8/1996 | Rostoker et al. ............ 703/14 |
| 5,604,895 A | | 2/1997 | Raimi |
| 5,605,895 A | * | 2/1997 | Bang et al. ................. 514/206 |
| 5,680,332 A | * | 10/1997 | Raimi et al. ................. 703/13 |
| 5,812,416 A | * | 9/1998 | Gupte et al. ................. 716/2 |
| 5,841,967 A | * | 11/1998 | Sample et al. ............... 714/33 |
| 5,883,809 A | * | 3/1999 | Sullivan et al. ............. 716/3 |
| 5,910,897 A | * | 6/1999 | Dangelo et al. ............. 716/19 |
| 5,920,490 A | * | 7/1999 | Peters ........................... 716/2 |
| 5,937,190 A | * | 8/1999 | Gregory et al. ............. 717/131 |
| 5,943,490 A | * | 8/1999 | Sample ........................ 703/28 |
| 5,953,521 A | * | 9/1999 | Dabral et al. ............... 713/401 |
| 6,052,524 A | * | 4/2000 | Pauna ......................... 703/22 |
| 6,182,206 B1 | * | 1/2001 | Baxter ......................... 712/43 |
| 6,195,627 B1 | | 2/2001 | Bargh et al. |
| 6,195,629 B1 | * | 2/2001 | Bargh et al. ................. 703/17 |
| 6,196,627 B1 | * | 3/2001 | Faust et al. ............. 297/180.14 |
| 6,202,042 B1 | * | 3/2001 | Bargh et al. ................. 703/16 |
| 6,212,491 B1 | * | 4/2001 | Bargh et al. ................. 703/14 |
| 6,223,142 B1 | * | 4/2001 | Bargh et al. ................. 703/15 |
| 6,470,478 B1 | * | 10/2002 | Bargh et al. .................. 716/4 |
| 6,920,418 B1 | * | 7/2005 | Roesner et al. ............. 703/17 |
| 6,941,257 B1 | * | 9/2005 | Roesner et al. ............. 703/15 |

OTHER PUBLICATIONS

U.S. Appl. No. 09/729,465, filed Dec. 2000, Derek Edward Williams.*

(Continued)

*Primary Examiner*—Paul L. Rodriguez
*Assistant Examiner*—Thomas Stevens
(74) *Attorney, Agent, or Firm*—Mark E. McBurney; Dillon & Yudell LLP

(57) ABSTRACT

A method, system, and data structure for overriding a signal during model simulation. An override signal port is instantiated within a model for delivering an override signal from an instrumentation entity to a signal selection means, wherein the signal selection means selects between the signal and the override signal. A signal override is declared during model simulation, and in response to the declared signal override, the override signal is selected utilizing the signal selection means.

6 Claims, 30 Drawing Sheets

OTHER PUBLICATIONS

U.S. Appl. No. 09/751,802, filed Dec. 2000, Roesner et al.*
U.S. Appl. No. 09/752,254, filed Dec. 2000, Roesner et al.*
U.S. Appl. No. 09/752,251, filed Dec. 2000, Roesner et al.*
U.S. Appl. No. 09/752,252, filed Dec. 2000, Roesner et al.*
Darringer et al., "EDA in IBM: Past, Present, and Future" IEEE Dec. 2000. p. 1476-1497.*
Synopsys, "Simulation—Tool Invocation Commands" version 1999. Oct. 10, 1999. p. 1-110.*
Wu et al., "Digital PWM Control: Application in Voltage Regulation Modules" IEEE 1999, p. 77-83.*
Improv Systems Inc. Presentation. 1999. p. 1-45.*
U.S. Appl. No. 09/345,163, Related Co-Pending Application John F. Bargh, et al., filed Jun. 29, 1999.
U.S. Appl. No. 09/729,465, Related Co-Pending Application Derek Edwards Williams, filed Dec. 05, 2000.
U.S. Appl. No. 09/751,802, Related Co-Pending Application Wolfgang Roesner, et al., filed Dec. 29, 2000.
U.S. Appl. No. 09/752,254, Related Co-Pending Application Wolfgang Roesner, et al., filed Dec. 30, 2000.
U.S. Appl. No. 09/752,251, Related Co-Pending Application Wolfgang Roesner, et al., filed Dec. 30, 2000.
U.S. Appl. No. 09/752,252, Related Co-Pending Application Wolfgang Roesner, et al., filed Dec. 30, 2000.

* cited by examiner

```
ENTITY FXUCHK IS
    PORT(   S_IN        :   IN std_ulogic;
            Q_IN        :   IN std_ulogic;
            R_IN        :   IN std_ulogic;
            clock       :   IN std_ulogic;
            fails       :   OUT std_ulogic_vector(0 to 1);
            counts      :   OUT std_ulogic_vector(0 to 2);
            harvests    :   OUT std_ulogic_vector(0 to 1);
    );
```
⎰ --!! BEGIN
452 ⎱ --!! Design Entity: FXU;

⎧ --!! Inputs
⎪ --!! S_IN      =>    B.C.S;
453 ⎨ --!! Q_IN    =>    A.Q;
⎪ --!! R_IN      =>    R;
⎪ --!! CLOCK     =>    clock;
⎩ --!! End Inputs ⎧ --!! Fail Outputs;
454 ⎨ --!! 0 : "Fail message for failure event 0";
⎪ --!! 1 : "Fail message for failure event 1";
⎩ --!! End Fail Outputs;

⎧ --!! Count Outputs;
⎪ --!! 0 : <event0> clock;
455 ⎨ --!! 1 : <event1> clock;
⎪ --!! 2 : <event2> clock;
⎩ --!! End Count Outputs;

⎧ --!! Harvest Outputs;
456 ⎨ --!! 0 : "Message for harvest event 0";
⎪ --!! 1 : "Message for harvest event 1";
⎩ --!! End Harvest Outputs;

457 ⎰ --!! End;

ARCHITECTURE example of FXUCHK IS

BEGIN

... HDL code for entity body section ...    } 458

END;

*Fig. 4C*

ENTITY FSM IS

PORT(
        ....ports for entity fsm....
    );

ARCHITECTURE FSM OF FSM IS

BEGIN

... HDL code for FSM and rest of the entity ...

fsm_state(0 to 2) < = ... Signal 801 ...

```
853 -{ --!! Embedded FSM  : examplefsm;
859 -{ --!! clock          : (fsm_clock);
854 -{ --!! state_vector   : (fsm_state(0 to 2));
855 -{ --!! states         : (S0, S1, S2, S3, S4);
856 -{ --!! state_encoding : ('000', '001', '010', '011', '100');
        --!! arcs          : (S0 = > S0, S0 = > S1, S0 = > S2,
857 -{  --!!                  (S1 = > S2, S1 = > S3, S2 = > S2,
        --!!                  (S2 = > S3, S3 = > S4, S4 = > S0);
858 -{ --!! End FSM;
```

852, 860

END;

*Fig. 8C*

<instantiation identifier>.<instrumentation entity name>.<design entity name>.<eventname>
1030                  1032                        1034               1036

*Fig. 10B*

| | 1030 | 1032 | 1034 | 1036 |
|---|---|---|---|---|
| X1 | B3 | X | | COUNT1 — 1040 |
| X1.Z | B1 | Z | | COUNT1 — 1041 |
| X1.Z | B2 | Z | | COUNT1 — 1042 |
| X2 | B3 | X | | COUNT1 — 1043 |
| X2.Z | B1 | Z | | COUNT1 — 1044 |
| X2.Z | B2 | Z | | COUNT1 — 1045 |
| Y | B4 | Y | | COUNT1 — 1046 |
| Y.Z | B1 | Z | | COUNT1 — 1047 |
| Y.Z | B2 | Z | | COUNT1 — 1048 |

*Fig. 10C*

<instantiation identifier>.<design entity name>.<eventname>
1030                       1034                  1036

*Fig. 10D*

```
--!! Inputs
--!! event_1108_in <= C.[B2.count.event_1108];      ~1161
--!! event_1124_in <= A.B.[B1.count.event_1124];    ~1162
--!! End Inputs
```
1163, 1165, 1164, 1166

*Fig. 11B*

```
--!! Inputs
--!! event_1108_in <= C.[count.event_1108];      ~1171
--!! event_1124_in <= B.[count.event_1124];      ~1172
--!! End Inputs
```

*Fig. 11C*

```
ENTITY X IS

PORT(  :
           :
        );

ARCHITECTURE example of X IS

BEGIN
    .
    .
    .
    ... HDL code for X ...
    .
    .
    .

1221 {  Y:Y
        PORT MAP(  :
                   :
                );

1222 {  A <= ....
        B <= ....
        C <= ....
                                            1230
1223 {  --!! [count, countname0, clock] <= Y.P;    1232
        --!! Q <= Y. [B1.count.count1] AND A;    1234
        --!! [fail, failname0, "fail msg"] <= Q XOR B;
        --!! [harvest, harvestname0, "harvest msg"] <= B AND C;
    END;                                1236
```
⎫
⎬ 1220
⎭

*Fig. 12B*

```
ENTITY OVR IS                                    ⌐1364
    PORT(  R_IN      :   IN std_ulogic_vector(0 .. 4);
                .
                .
                .
           ... other ports as required ...
                .
                .                                ⌐1362
                .
           R_OV      :   OUT std_ulogic_vector(0 .. 4);
           RT        :   OUT std_ulogic
        );                                     ⌐1363
--!! BEGIN
--!! Design Entity: FOO;

--!! Inputs (0 to 4)
--!! R_IN => {R(0 .. 4)};      ⌐1360
--!! :
... other ports as needed ...
--!! :
--!! End Inputs
       ⌠ --!! Outputs                  ⌐1361
1356 ⎨ --!! <R_OVRRIDE> : R_OV(0 .. 4) => R(0 .. 4) [RT];
       ⌡ --!! End Outputs --!! End ARCHITECTURE example of OVR IS

BEGIN

... HDL code for entity body section ...  }1358

END;
```

ENTITY FOO IS

PORT(  :
                  :
                  :
       );

ARCHITECTURE example of FOO IS

BEGIN

.
    .
    .

R <= ......

.
    .
    .

```
1380 {  --!! R_IN <= {R};        ← 1381
        --!!
        --!!                     ← 1382
        --!! R_OV(0 to 4) <= ......;   ← 1383
        --!! RT <= ......;
        --!! [override, R_OVRRIDE, R(0 .. 4), RT] <= R_OV(0 to 4);
}
                                 ← 1384
```

*Fig. 13D*

SIGNAL OVERRIDE FOR SIMULATION MODELS

CROSS REFERENCE TO RELATED APPLICATIONS

The present application is related to the following copending U.S. Patent Applications: U.S. patent application Ser. No. 09/345,163 filed on Jun. 29, 1999, titled "Method And System For Counting Events Within A Simulation Model"; U.S. patent application Ser. No. 09/729,465 filed on Dec. 29, 2000, titled "Embedded Hardware Description Language Instrumentation"; U.S. patent application Ser. No. 09/751,802 filed on Dec. 29, 2000, titled "Naming And Managing Simulation Model Events"; U.S. patent application Ser. No. 09/752,252 filed on Dec. 30, 2000, titled "Detecting Events Within Simulation Models"; U.S. patent application Ser. No. 09/752,251 filed on Dec. 30, 2000, titled "Randomized Simulation Model Instrumentation"; and U.S. patent application Ser. No. 09/752,254 filed on Dec. 30, 2000, titled "Hierarchical Processing Of Simulation Model Events". The above-mentioned patent applications are assigned to the assignee of the present invention and are incorporated herein by reference.

BACKGROUND OF THE INVENTION

1. Technical Field

The present invention relates in general to designing and simulating digital devices, modules and systems. In particular, the present invention relates to a method and system that improve the model build and simulation processes in order to allow a designer to easily instrument and monitor a simulation model. More particularly, the present invention relates to overriding signals within hardware description language models during simulation.

2. Description of the Related Art

Verifying the logical correctness of a digital design and debugging the design, if necessary, are very important steps in most digital design processes. Logic networks are tested either by actually building networks or by simulating networks on a computer. As logic networks become highly complex, it becomes necessary to simulate a design before the design is actually built. This is especially true when the design is implemented as an integrated circuit, since the fabrication of integrated circuits requires considerable time and correction of mistakes is quite costly. The goal of digital design simulation is the verification of the logical correctness of the design.

In a typical automated design process that is supported by a conventional electronic computer-aided design (ECAD) system, a designer enters a high-level description utilizing a hardware description language (HDL), such as VHDL, producing a representation of the various circuit blocks and their interconnections. The ECAD system compiles the design description into a format that is best suited for simulation. A simulator is then utilized to verify the logical correctness of the design prior to developing a circuit layout.

A simulator is typically a software tool that operates on a digital representation, or simulation model of a circuit, and a list of input stimuli representing inputs of the digital system. A simulator generates a numerical representation of the response of the circuit which may then either be viewed on the display screen as a list of values or further interpreted, often by a separate software program, and presented on the display screen in graphical form. The simulator may be run either on a general purpose computer or on another piece of electronic apparatus specially designed for simulation. Simulators that run entirely in software on a general purpose computer will hereinafter be referred to as "software simulators". Simulators that are run with the assistance of specially designed electronic apparatus will hereinafter be referred to as "hardware simulators".

Usually, software simulators perform a very large number of calculations and operate slowly from the user's point of view. In order to optimize performance, the format of the simulation model is designed for very efficient use by the simulator. Hardware simulators, by nature, require that the simulation model comprising the circuit description be communicated in a specially designed format. In either case, a translation from an HDL description to a simulation format, hereinafter referred to as a simulation executable model, is required.

Simulation has become a very costly and time-consuming segment of the overall design process as designs become increasingly complex. Therefore, great expense is invested to ensure the highest possible accuracy and efficiency in the processes utilized to verify digital designs. A useful method of addressing design complexity is to simulate digital designs at several levels of abstraction. At the functional level, system operation is described in terms of a sequence of transactions between registers, adders, memories and other functional units. Simulation at the functional level is utilized to verify the high-level design of high-level systems.

At the logical level, a digital system is described in terms of logic elements such as logic gates and flip-flops. Simulation at the logic level is utilized to verify the correctness of the logic design. At the circuit level, each logic gate is described in terms of its circuit components such as transistors, impedences, capacitances, and other such devices. Simulation at the circuit level provides detailed information about voltage levels and switching speeds.

VHDL is a higher level language for describing the hardware design of complex devices. The overall circuit design is frequently divided into smaller parts, hereinafter referred to as design entities, which are often individually designed by different design engineers, and then combined in a hierarchical manner to create an overall model. This hierarchical design technique is very useful in managing the enormous complexity of the overall design. Another advantage of this approach is that errors in a design entity are easier to detect when that entity is simulated in isolation.

Comprehensive model verification often requires modeled signal values to be dynamically overridden during a simulation run. For example, a bus within an integrated circuit may carry signals that provide error correction values. Such error correction signals, in conjunction with bus data transmission signals, can be utilized to determine when inadvertent bus signal alterations occur due to external physical causes. An example of such an external physical cause is electrical noise near a bus signal that alters the bus signal value. Error correction signals generated at the source of the bus are examined by error correction logic at the bus destination that then corrects the error.

The simulation process includes no direct analogue to the external physical circumstances that can alter the bus signals. During simulation, error correction and bus signals are faithfully represented without inadvertent alteration.

Simulations of a given model on a simulator are typically controlled by a program, hereinafter referred to as the RTX (Run Time executive), written in a high level language such as C or C++. A simulator provides interface routines that an RTX calls to control simulation. These routines implement functions for reading signal values out of a model, cycling a model, altering signals values within a model, etc.

In order to effectively simulate and verify error correction logic, a simulation run must be altered to include instructions for overriding bus signals. Typically, an RTX calls a simulator interface routine, herein after referred to as PUT-FAC, to directly alter a signal value during simulation thus injecting an error and precipitating activation of the error correction logic.

Using the RTX and PUTFAC to dynamically alter signals during simulation has two inherent shortcomings. First, the PUTFAC routine performs poorly on hardware simulators. Second, RTX is typically written in a high level programming language that may be unfamiliar to design engineers conversant in HDLs such as VHDL or Verilog.

It would therefore be useful to provide a means for altering signal values within a simulation model that is more accessible to design engineers, and furthermore, performs efficiently when utilized in conjunction with a hardware simulator.

SUMMARY OF THE INVENTION

A method, system, and data structure for overriding a signal during model simulation are disclosed herein. An override signal port is instantiated within a model for delivering an override signal from an instrumentation entity to a signal selection means, wherein the signal selection means selects between the signal and the override signal. A signal override is declared during model simulation, and in response to the declared signal override, the override signal is selected utilizing the signal selection means.

BRIEF DESCRIPTION OF THE DRAWINGS

The novel features believed characteristic of the invention are set forth in the appended claims. The invention itself, however, as well as a preferred mode of use, further objects, and advantages thereof, will best be understood by reference to the following detailed description of an illustrative embodiment when read in conjunction with the accompanying drawings, wherein:

FIG. 4C illustrates exemplary sections of HDL syntax that maybe utilized in a preferred embodiment of the present invention;

FIG. 8C illustrates a hardware description language file including embedded instrumentation in accordance with a preferred embodiment of the present invention.

FIG. 10B depicts a data structure for declaring an event within a simulation model in accordance with one embodiment of the present invention;

FIG. 10C illustrates a list of extended event data structures for the simulation model in FIG. 10A;

FIG. 10D depicts a data structure for declaring an event within a simulation model in accordance with an alternate embodiment of the present invention;

FIG. 11B depicts a set of input port mapping comments for performing hierarchical processing of simulation model events in accordance with a first embodiment of the present invention;

FIG. 11C illustrates a set of input port mapping comments for performing hierarchical processing of simulation model events in accordance with a second embodiment of the present invention;

FIG. 12B illustrates an exemplary HDL file for implementing instrumentation logic within an HDL design entity in accordance with a preferred embodiment of the present invention;

FIG. 13C depicts an exemplary HDL source file that describes instrumentation entity in accordance with a preferred embodiment of the present invention; and FIG. 13D illustrates an HDL design entity source code file wherein a set of random instrumentation comments implement the logic necessary for selectively overriding a simulation signal in accordance with a preferred embodiment of the present invention.

DETAILED DESCRIPTION OF THE PREFERRED EMBODIMENT

The present invention provides for accurate and comprehensive monitoring of a digital circuit design in which a designer creates instrumentation modules utilizing the same hardware description language (HDL) as utilized for the design itself. HDLs, while suited to the needs of digital designers can also be effectively utilized for a number of checking functions. In accordance with the Method and System of the present invention, instrumentation modules are utilized to monitor specified design parameters while not becoming compiled as an integral part of the design itself. Furthermore, since the instrumentation modules are written in the same HDL as utilized in the actual design, such modules are platform and simulator independent. Unlike checking done with C or C++ programs, HDL instrumentation can be compiled and run directly without loss of performance on hardware simulators.

Figure 1:
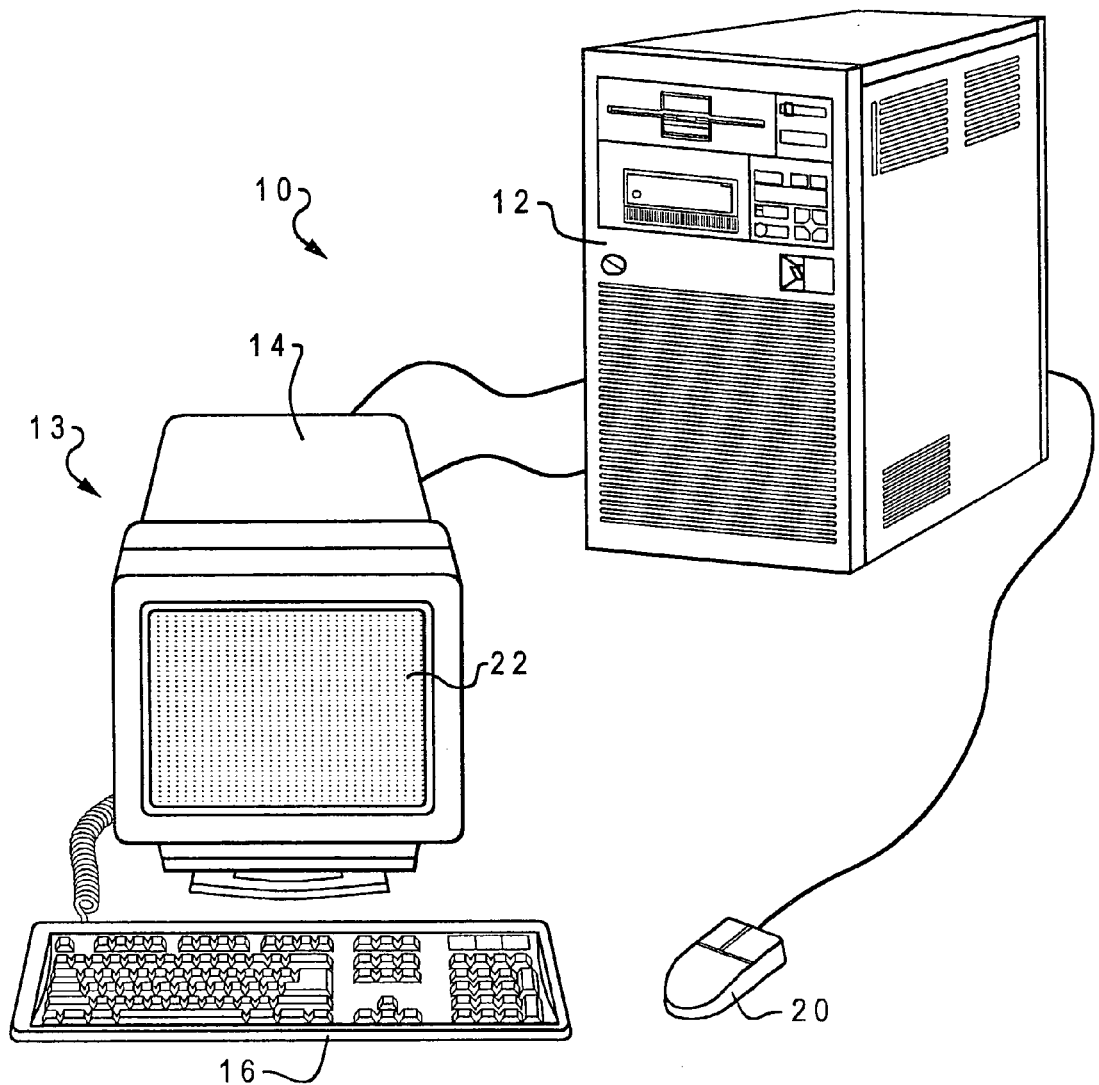
FIG. 1 is a pictorial representation of a data processing system in which a preferred embodiment of the present invention may be practiced.

With reference now to the figures, and in particular with reference to FIG. 1, there is depicted a pictorial representation of a data processing system 10 with which the present invention may be advantageously utilized. As illustrated, data processing system 10 comprises a workstation 12 to which one or more nodes 13 are connected. Workstation 12 preferably comprises a high performance multiprocessor computer, such as the RISC System/6000 or AS/400 computer systems available from International Business Machines Corporation (IBM). Workstation 12 preferably includes nonvolatile and volatile internal storage for storing software applications comprising an ECAD system, which can be utilized to develop and verify a digital circuit design in accordance with the method and system of the present invention. As depicted, nodes 13 are comprised of a display device 14, a keyboard 16, and a mouse 20. The ECAD software applications executed within workstation 12 preferably display a graphic user interface (GUI) within display screen 22 of display device 14 with which a digital circuit designer can interact using a keyboard 16 and mouse 20. Thus, by entering appropriate inputs utilizing keyboard 16 and mouse 20, the digital circuit designer is able to develop and verify a digital circuit design according to the method described further hereinbelow.

Figure 2:
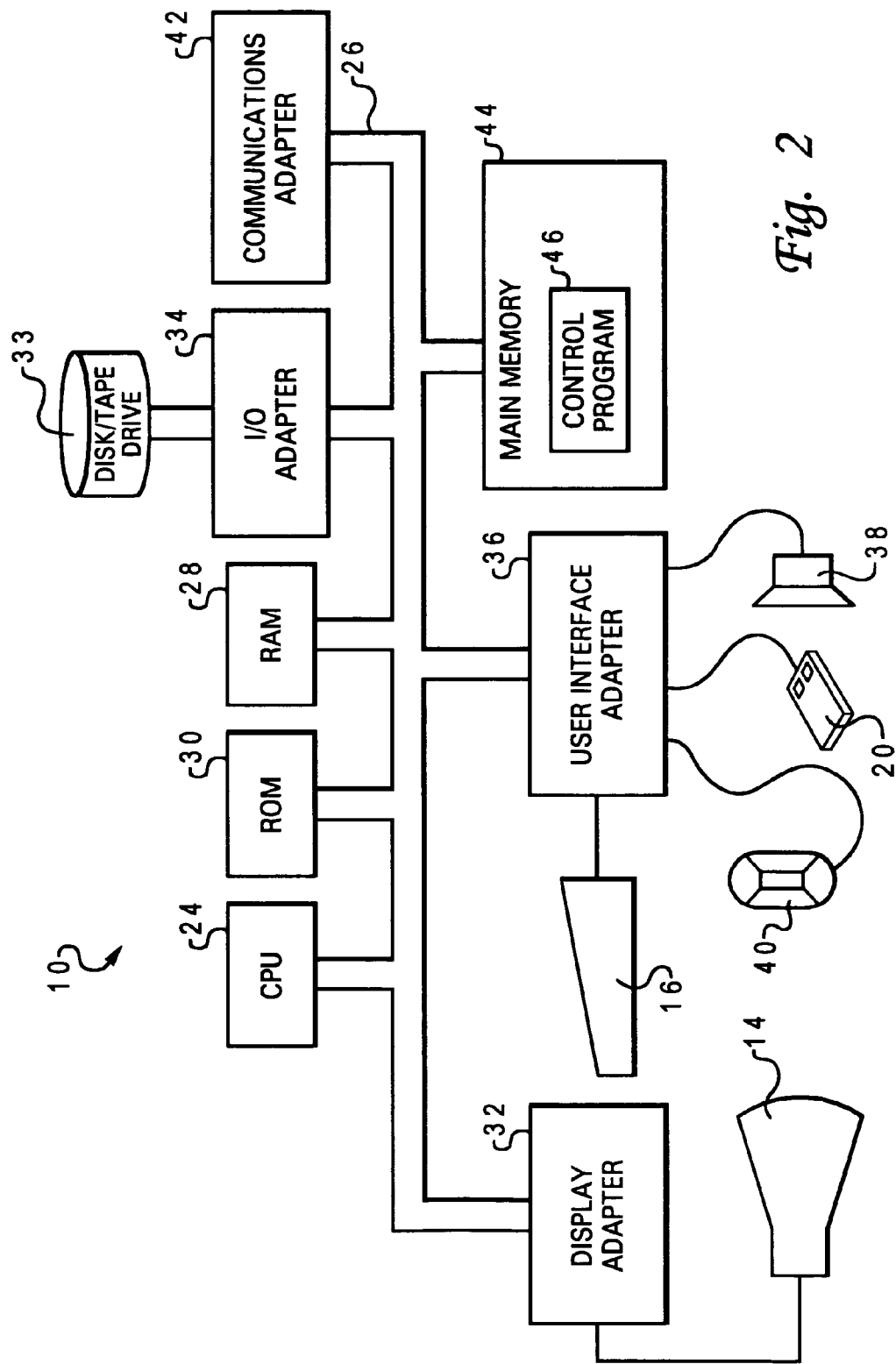
FIG. 2 depicts a representative hardware environment of the data processing system illustrated in FIG. 1.

FIG. 2 depicts a representative hardware environment of data processing system 10. Data processing system 10 is configured to include all functional components of a computer and its associated hardware. Data processing system 10 includes a Central Processing Unit ("CPU") 24, such as a conventional microprocessor, and a number of other units interconnected via system bus 26. CPU 24 includes a portion of data processing system 10 that controls the operation of the entire computer system, including executing the arithmetical and logical functions contained in a particular computer program. Although not depicted in FIG. 2, CPUs such as CPU 24 typically include a control unit that organizes data and program storage in a computer memory and transfers the data and other information between the various parts of the computer system. Such CPUs also generally include an arithmetic unit that executes the arithmetical and logical operations, such as addition, comparison, multiplications and so forth. Such components and units of data processing system 10 can be implemented in a system unit such as workstation 12 of FIG. 1.

Data processing system 10 further includes random-access memory (RAM) 28, read-only memory (ROM) 30, display adapter 32 for connecting system bus 26 to display device 14, and I/O adapter 34 for connecting peripheral devices (e.g., disk and tape drives 33) to system bus 26. RAM 28 is a type of memory designed such that the location of data stored in it is independent of the content. Also, any location in RAM 28 can be accessed directly without having to work through from the beginning. ROM 30 is a type of memory that retains information permanently and in which the stored information cannot be altered by a program or normal operation of a computer.

Display device 14 provides the visual output of data processing system 10. Display device 14 can be a cathode-ray tube (CRT) based video display well known in the art of computer hardware. However, with a portable or notebook-based computer, display device 14 can be replaced with a liquid crystal display (LCD) based or gas plasma-based flat-panel display. Data processing system 10 further includes user interface adapter 36 for connecting keyboard 16, mouse 20, speaker 38, microphone 40, and/or other user interface devices, such as a touch-screen device (not shown), to system bus 26. Speaker 38 is one type of audio device that may be utilized in association with the method and system provided herein to assist diagnosticians or computer users in analyzing data processing system 10 for system failures, errors, and discrepancies. Communications adapter 42 connects data processing system 10 to a computer network. Although data processing system 10 is shown to contain only a single CPU and a single system bus, it should be understood that the present invention applies equally to computer systems that have multiple CPUs and to computer systems that have multiple buses that each perform different functions in different ways.

Data processing system 10 also includes an interface that resides within a machine-readable media to direct the operation of data processing system 10. Any suitable machine-readable media may retain the interface, such as PAM 28, ROM 30, a magnetic disk, magnetic tape, or optical disk (the last three being located in disk and tape drives 33). Any suitable operating system and associated interface (e.g., Microsoft Windows) may direct CPU 24. For example, the AIX operating system and AIX Windows windowing system can direct CPU 24. The AIX operating system is IBM's implementation of the UNIX™ operating system. Other technologies also can be utilized in conjunction with CPU 24, such as touch-screen technology or human voice control.

Those skilled in the art will appreciate that the hardware depicted in FIG. 2 may vary for specific design and simulation applications. For example, other peripheral devices such as optical disk media, audio adapters, or chip programming devices, such as PAL or EPROM programming devices well-known in the art of computer hardware and the like, may be utilized in addition to or in place of the hardware already depicted. In addition, main memory 44 is connected to system bus 26, and includes a control program 46. Control program 46 resides within main memory 44, and contains instructions that, when executed on CPU 24, carries out the operations depicted in FIG. 4D and FIG. 4E described herein.

Figure 3A:
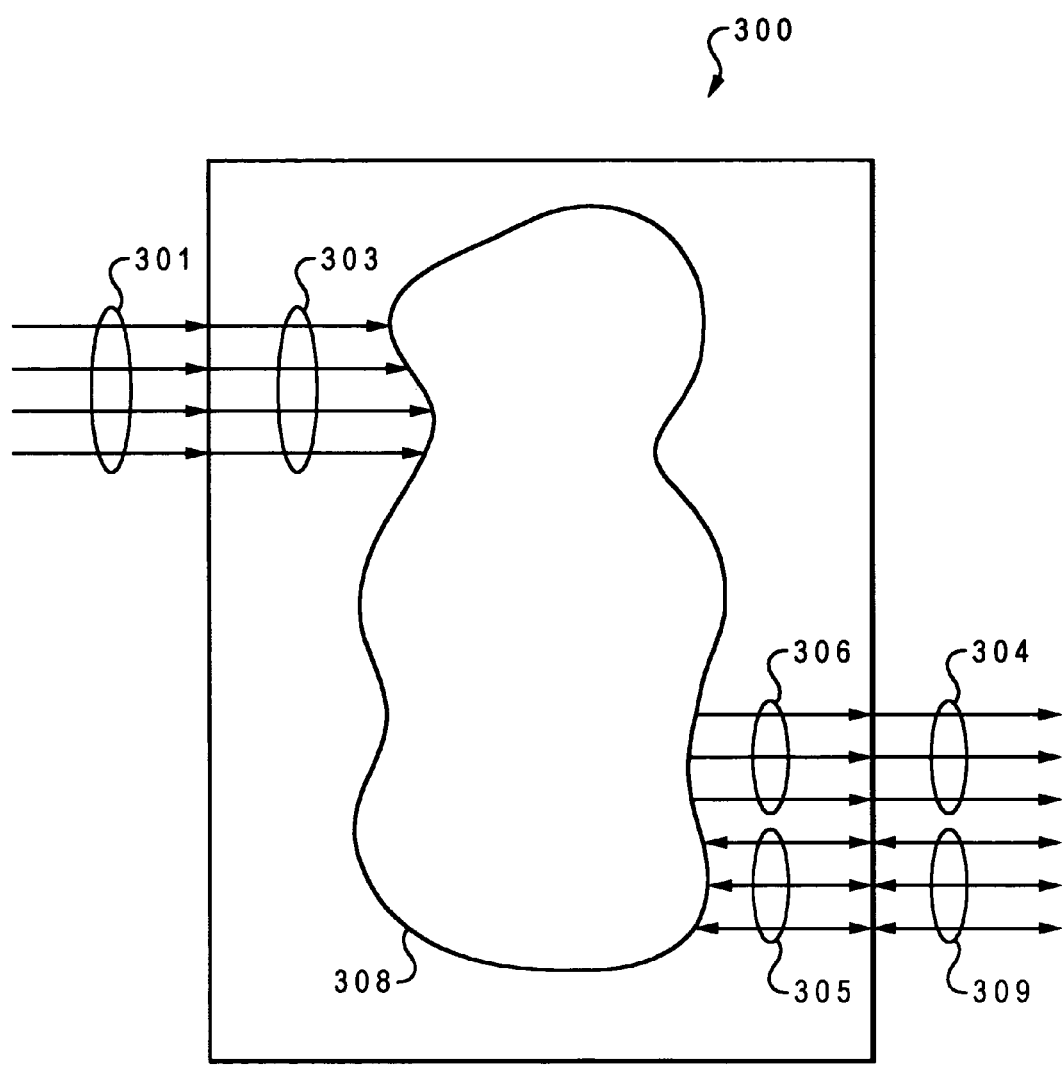
FIG. 3A is a simplified block diagram illustrating a digital design entity that may be instrumented in accordance with a preferred embodiment of the present invention.

Simulated digital circuit design models are comprised of at least one and usually many sub-units referred to hereinafter as design entities. FIG. 3A is a block diagram representation of an exemplary design entity 300 in which the method and system of the present invention may be implemented. Design entity 300 is defined by a number of components: an entity name, entity ports, and a representation of the function performed by design entity 300. Each entity within a given model has a unique name (not explicitly shown in FIG. 3A) that is declared in the HDL description of each entity. Furthermore, each entity typically contains a number of signal interconnections, known as ports, to signals outside the entity. These outside signals may be primary input/outputs (I/Os) of an overall design or signals connecting to other entities within an overall design.

Typically, ports are categorized as belonging to one of three distinct types: input ports, output ports, and bi-directional ports. Design entity 300 is depicted in as having a number of input ports 303 that convey signals into design entity 300. Input ports 303 are connected to input signals 301. In addition, design entity 300 includes a number of output ports 306 that convey signals out of design entity 300. Output ports 306 are connected to a set of output signals 304. Bi-directional ports 305 are utilized to convey signals into and out of design entity 300. Bi-directional ports 305 are in turn connected to a set of bi-directional signals 309. An entity, such as design entity 300, need not contain ports of all three types, and in the degenerate case, contains no ports at all. To accomplish the connection of entity ports to external signals, a mapping technique, known as a "port map", is utilized. A port map (not explicitly depicted in FIG. 3A) consists of a specified correspondence between entity port names and external signals to which the entity is connected. When building a simulation model, ECAD software is utilized to connect external signals to appropriate ports of the entity according to a port map specification.

Finally, design entity 300 contains a body section 308 that describes one or more functions performed by design entity 300. In the case of a digital design, body section 308 contains an interconnection of logic gates, storage elements, etc., in addition to instantiations of other entities. By instantiating an entity within another entity, a hierarchical description of an overall design is achieved. For example, a microprocessor may contain multiple instances of an identical functional unit. As such, the microprocessor itself will often be modeled as a single entity. Within the microprocessor entity, multiple instantiations of any duplicated functional entities will be present.

Figure 3B:
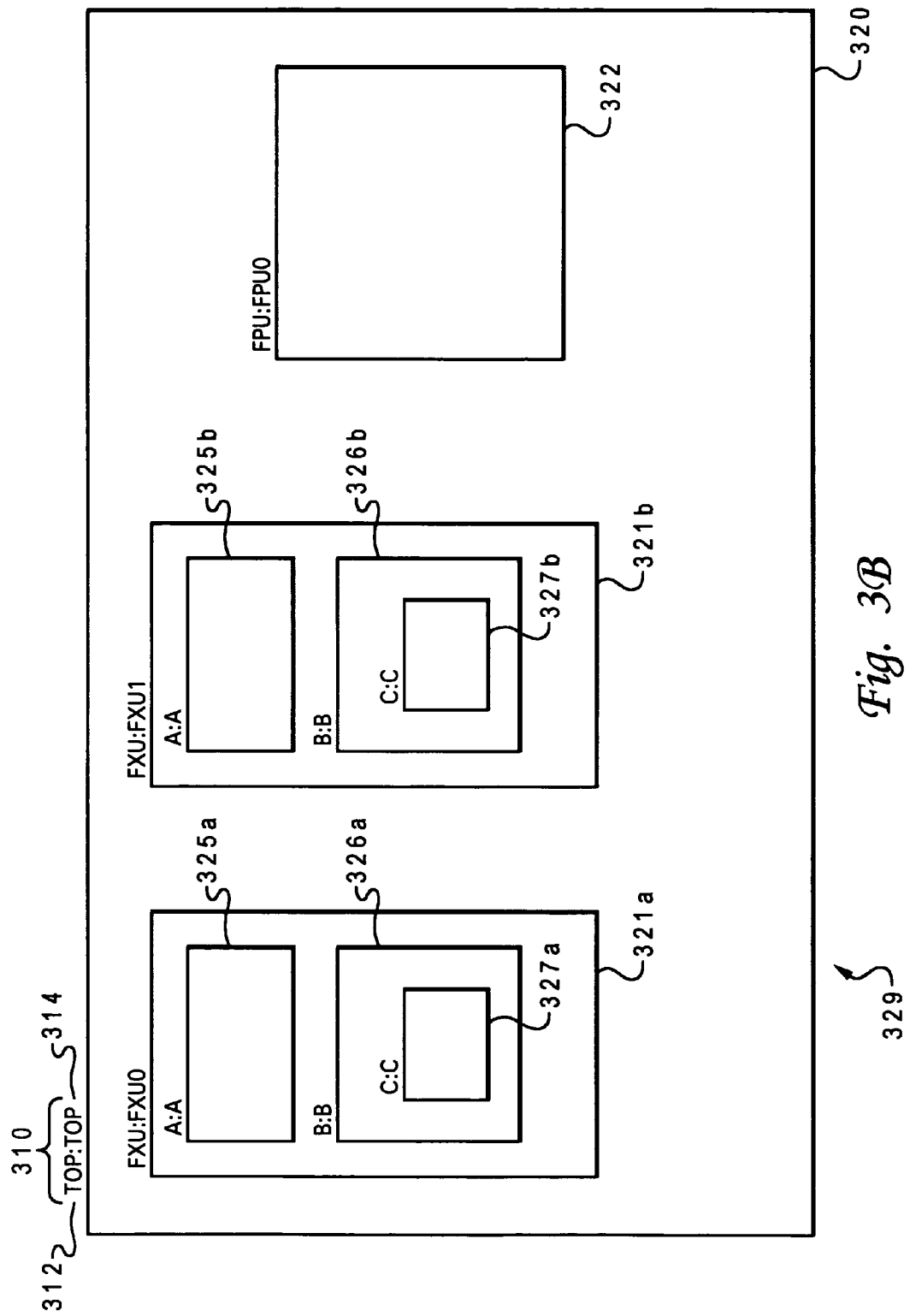
FIG. 3B is a diagrammatic representation depicting a simulation model that may be instrumental in accordance with a preferred embodiment of the present invention.

Referring now to FIG. 3B, there is illustrated a diagrammatic representation of an exemplary simulation model 329 in which a preferred embodiment of the present invention may be advantageously utilized. Simulation model 329 consists of multiple hierarchical entities. For visual simplicity and clarity, the ports and signals interconnecting the entities within simulation model 329 have not been explicitly shown. In any model, one and only one entity is the so-called "top-level entity". A top-level entity 320, is that entity which encompasses all other entities within simulation model 329. That is to say, top-level entity 320 instantiates, either directly or indirectly, all descendant entities within a design. Simulation model 329 consists of top-level entity 320 which directly instantiates two instances, 321a and 321b, of an FXU entity 321 and a single instance of an FPU entity 322. Each instantiation has an associated description, which contains an entity name and a unique instantiation name. For top-level entity 320, description 310 is labeled "TOP:TOP". Description 310 includes an entity name 312, labeled as the "TOP" preceding the colon, and also includes an instantiation name 314, labeled as the "TOP" following the colon.

It is possible for a particular entity to be instantiated multiple times as is depicted with instantiations 321a and 321b of FXU entity 321. Instantiations 321a and 321b are distinct instantiations of FXU entity 321 with instantiation names FXU0 and FXU1 respectively. Top-level entity 320 is at the highest level within the hierarchy of simulation model 329. An entity that instantiates a descendant entity will be referred to hereinafter as an "ancestor" of the descendant entity. Top-level entity 320 is therefore the ancestor that directly instantiates FXU entity instantiations 321a and 321b. At any given level of a simulation model hierarchy, the instantiation names of all instantiations must be unique.

In addition to FXU entity instantiations 321a and 321b, top-level entity 320 directly instantiates a single instance of a FPU entity 322 having an entity name FPU and instantiation name FPU0. Within an entity description, it is common for the entity name to match the instantiation name when only one instance of that particular entity is placed at a given level of a simulation model hierarchy. However, this is not required as shown by entity 322 (instantiation name FPU0, entity name FPU).

Within instantiation 321a of FXU entity 321, single instance entities 325a and 326a of entity A 325 and entity B 326 respectively, are directly instantiated. Similarly instantiation 321b of the same FXU entity contains instantiations 325b and 326b of entity A 325 and entity B 326 respectively. In a similar manner, instantiation 326a and instantiation 326b each directly instantiate a single instance of entity C 327 as entities 327a and 327b respectively. The nesting of entities within other entities can continue to an arbitrary level of complexity provided that all entities instantiated, whether singly or multiply, have unique entity names and the instantiation names at any given level of the hierarchy are unique with respect to one another. Each entity is constructed from one or more HDL files that contain the information necessary to describe the entity.

Associated with each entity instantiation is a so called "instantiation identifier". The instantiation identifier for a given instantiation is a string consisting of the enclosing entity instantiation names proceeding from the top-level entity instantiation name. For example, the instantiation identifier of instantiation 327a of entity C 327 within instantiation 321a of FXU entity 321 is "TOP.FXU0.B.C". This identifier serves to uniquely identify each instantiation within a simulation model.

Figure 3C:
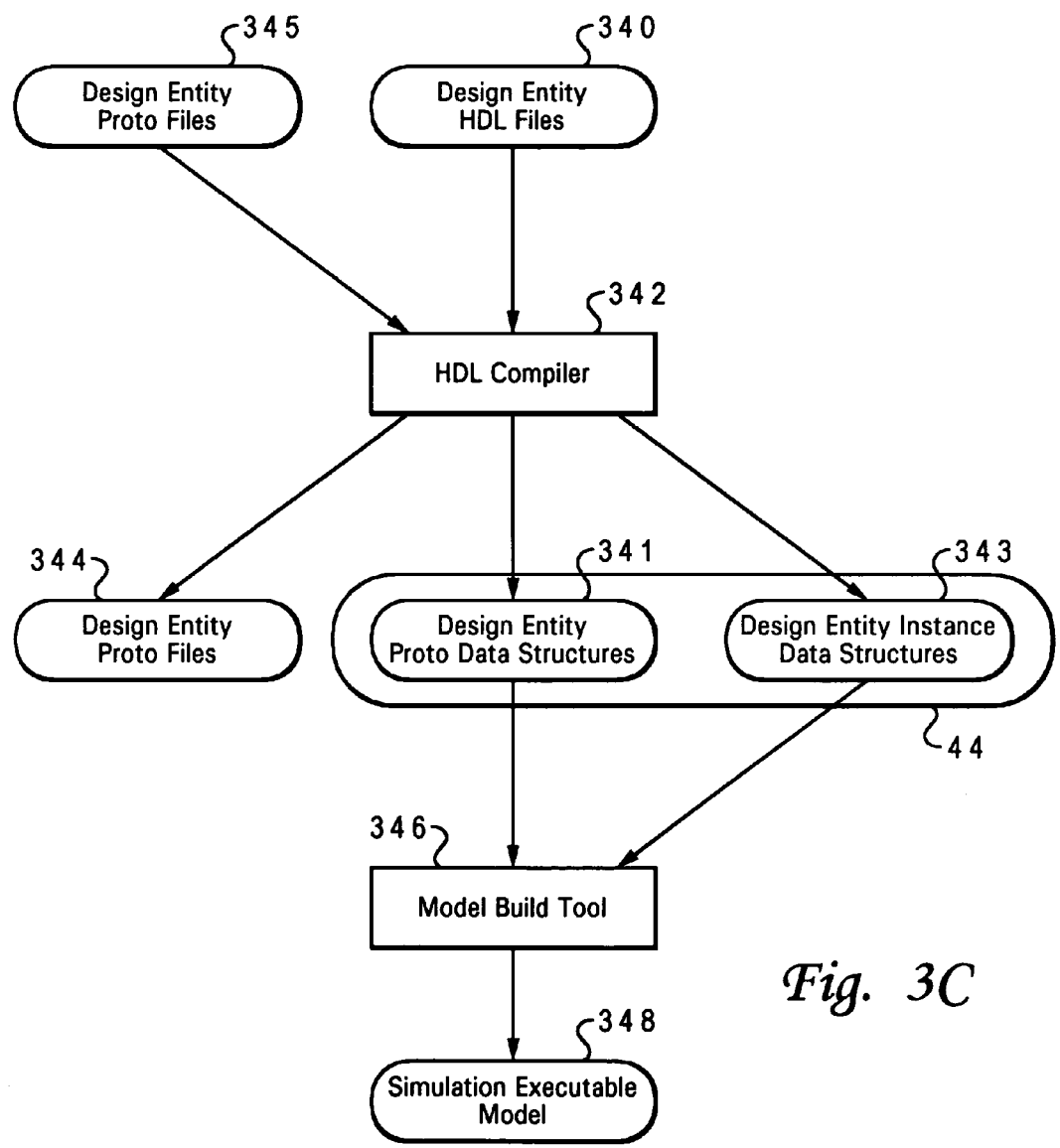
FIG. 3C is a flow diagram illustrating of a model build process in which a preferred embodiment of the present invention may be implemented.

Referring now to FIG. 3C, there is depicted a flow diagram of a model build process in which a preferred embodiment of the present invention may be implemented. The process begins with one or more design entity HDL source code files 340 and, potentially, one or more design entity intermediate format files 345, hereinafter referred to as "proto files" 345, available from a previous run of an HDL compiler 342. HDL compiler 342 processes HDL file(s) 340 beginning with the top level entity of a simulation model and proceeding in a recursive fashion through all HDL or proto file(s) describing a complete simulation model. For each of HDL files 340 during the compilation process, HDL compiler 342, examines proto files 345 to determine if a previously compiled proto file is available and consistent. If such a file is available and consistent, HDL compiler 342 will not recompile that particular file, but will rather refer to an extant proto file. If no such proto file is available or the proto file is not consistent, HDL compiler 342 explicitly recompiles the HDL file 340 in question and creates a proto file 344, for use in subsequent compilations. Such a process will be referred to hereinafter as "incremental compilation" and can greatly speed the process of creating a simulation executable model 348. Incremental compilation is described in further detail hereinbelow. Once created by HDL compiler 342, Proto files 344 are available to serve as proto files 345 in subsequent compilations.

In addition to proto files 344, HDL compiler 342 also creates two sets of data structures, design entity proto data structures 341 and design entity instance data structures 343, in memory 44 of computer system 10. Design entity proto data structures 341 and design entity instance data structures 343, serve as a memory image of the contents of a simulation executable model 348. Data structures 341 and 343 are passed, via memory 44, to a model build tool 346 that processes data structures 341 and 343 into simulation executable model 348.

It will be assumed hereinafter that each entity is described by a single HDL file. Depending on convention or the particular HDL in which the current invention is practiced, this restriction may be required. However, in certain circumstances or for certain HDLs it is possible to describe an entity by utilizing more than one HDL file. Those skilled in the art will appreciate and understand the extensions necessary to practice the present invention if entities are permitted to be described by multiple HDL files. Furthermore, it will be assumed that there is a direct correspondence, for each entity, between the entity name and both of the following: the name of the HDL file representing the entity, and the name of the proto file for the entity.

In the following description, an HDL source code file corresponding to a given entity will be referred to by an entity name followed by ".vhdl". For example, the HDL source code file that describes top-level entity 320 will be referred to as TOP.vhdl. This labeling convention serves as a notational convenience only and should not be construed as limiting the applicability of the present invention to HDLs other than VHDL.

Returning to FIG. 3B, it can be seen that each entity may instantiate, either directly or indirectly, one or more other entities. For example, the FXU entity directly instantiates A entity 325 and B entity 326. Furthermore, B entity 326 directly instantiates C entity 327. Therefore, FXU entity 321 instantiates, directly or indirectly, A entity 325, B entity 326 and C entity 327. Those entities, that are directly or indirectly instantiated by another entity, will be referred to hereinafter as "descendants". The descendants of top level entity 320 are FXU entity 321, FPU entity 322, A entity 325, B entity 326, and C entity 327. It can be seen that each entity has a unique set of descendants and that each time an entity is instantiated, a unique instance of the entity and its descendants is created. Within simulation model 329, FXU entity 321 is instantiated twice, FXU:FXU0 321a and FXU:FXU1 321b, by top-level entity 320. Each instantiation of FXU entity 321 creates a unique set of instances of the FXU, A, B, and C entities.

For each entity, it is possible to define what is referred to as a "bill-of-materials" or BOM. A BOM is a list of HDL files having date and time stamps of the entity itself and the entity's descendants. Referring again to FIG. 3C, the BOM for an entity is stored in proto file 344 after compilation of the entity. Therefore, when HDL compiler 342 compiles a particular HDL source code file among HDL files 340, a proto file 344 is generated that includes a BOM listing the HDL files 340 that constitute the entity and the entity's descendants, if any. The BOM also contains the date and time stamp for each of the HDL files referenced as each appeared on disk/tape 33 of computer system 10 when the HDL file was being compiled.

If any of the HDL files constituting an entity or the entity's descendants is subsequently changed, proto file 344 will be flagged as inconsistent and HDL compiler 342 will recompile HDL file 340 on a subsequent re-compilation as will be described in further detail below. For example, going back to FIG. 3B, the HDL files referenced by the BOM of FXU entity 321 are FXU.vhdl, A.vhdl, B.vhdl and C.vhdl, each with appropriate date and time stamps. The files referenced by the BOM of top-level entity 320 are TOP.vhdl, FXU.vhdl, A.vhdl, B.vhdl, C.vhdl, and FPU.vhdl with appropriate date and time stamps.

Returning to FIG. 3C, HDL compiler 342 creates an image of the structure of a simulation model in main memory 44 of computer system 10. This memory image is comprised of the following components: "proto" data structures 341 and "instance" data structures 343. A proto is a data structure that, for each entity in the model, contains information about the ports of the entity, the body contents of the entity, and a list of references to other entities directly instantiated by the entity (in what follows, the term "proto" will be utilized to refer to the in-memory data structure described above and the term "proto file" will be utilized to describe intermediate format file(s) 344). Proto files 344 are therefore on-disk representations of the in-memory proto data structure produced by HDL compiler 342.

An instance data structure is a data structure that, for each instance of an entity within a model, contains the instance name for the instance, the name of the entity the instance refers to, and the port map information necessary to interconnect the entity with external signals. During compilation, each entity will have only one proto data structure, while, in the case of multiple instantiations of an entity, each entity may have one or more instance data structures.

In order to incrementally compile a model efficiently, HDL compiler 342 follows a recursive method of compilation in which successive entities of the model are considered and loaded from proto files 345 if such files are available and are consistent with the HDL source files constituting those entities and their descendants. For each entity that cannot be loaded from existing proto files 345, HDL compiler 342 recursively examines the descendants of the entity, loads those descendant entities available from proto file(s) 345 and creates, as needed, proto files 344 for those descendants that are inconsistent with proto files 345. Psuedocode for the main control loop of HDL compiler 342 is shown below (the line numbers to the right of the psuedocode are not a part of the psuedocode, but merely serve as a notational convenience).

```
process_HDL_file(file)                              5
{                                                   10
    if (NOT proto_loaded(file)) {                   15
    if (exists_proto_file(file) AND
        check_bom(file)) {                          20
            load_proto(file);                       25
    } else {                                        30
```

```
                parse_HDL_file(file)                    35
                for (all instances in file){            40
                    process_HDL_file(instance);         45
                }                                       50
                if (design_flag = TRUE) {               55
                    for(al instrumentation instances
                        in file) {                      60
                            process_HDL_file2(instance,
                                FALSE);                 65
                    }                                   70
                }                                       75
            create_proto(file);                         80
            write_proto_file(file);                     90
            }                                           95
        }                                              100
        if (design_flag=TRUE) {                        105
            create_instance(file):                     110
        }                                              115
    }                                                  120
```

When compiler 342 is initially invoked, no proto data structures 341 or instance data structures 343 are present in memory 44 of computer system 10. The main control loop, routine process_HDL_file( ) (line 5), is invoked and passed the name of the top level entity by means of parameter "file". The algorithm first determines if a proto data structure for the current entity is present in memory 44 by means of routine proto_loaded( ) (line 15). Note that the proto data structure for the top level entity will never be present in memory because the process starts without any proto data structures loaded into memory 44. If a matching proto data structure is present in memory 44, instance data structures for the current entity and the current entity's descendants, if any, are created as necessary in memory 44 by routine create_instance( ) (line 75).

However, if a matching proto data structure is not present in memory 44, control passes to line 20 where routine exists_proto_file( ) examines proto files 345 to determine if a proto file exists for the entity. If and only if a matching proto file exists, routine check_bom( ) is called to determine whether proto file 345 is consistent. In order to determine whether the proto file is consistent, the BOM for the proto file is examined. Routine check_bom( ) examines each HDL source code file listed in the BOM to determine if the date or time stamps for the HDL source code file have changed or if the HDL source code file has been deleted. If either condition occurs for any file in the BOM, the proto file is inconsistent and routine check_bom( ) fails. However, if check_bom( ) is successful, control is passed to line 25 where routine load_proto( ) loads the proto file and any descendant proto files into memory 44, thus creating proto data structures 341 for the current entity and the current entity's descendants, if any. The construction of process_HDL_file( ) ensures that once a proto file has been verified as consistent, all of its descendant proto files, if any, are also consistent.

If the proto file is either non-existent or is not consistent, control passes to line 35 where routine parse_HDL_file( ) loads the HDL source code file for the current entity. Routine parse_HDL_file( ) (line 35) examines the HDL source code file for syntactic correctness and determines which descendant entities, if any, are instantiated by the current entity. Lines 40, 45, and 50 constitute a loop in which the routine process_HDL_file( ) is recursively called to process the descendent entities that are called by the current entity. This process repeats recursively traversing all the descendants of the current entity in a depth-first fashion creating proto data structures 341 and proto data files 344 of all descendants of the current entity. Once the descendant entities are processed, control passes to line 55 where a new proto data structure is created for the current entity in memory 44 by routine create_proto( ). Control then passes to line 60 where a new proto file 344, including an associated BOM, is written to disk 33 by routine write_proto_file( ). Finally, control passes to line 75 where routine create_instance( ) creates instance data structures 343 for the current entity and any descendant entities as necessary. In this manner, process_HDL_file( ) (line 5) recursively processes the entire simulation model creating an in-memory image of the model consisting of proto data structures 341 and instance data structures 343.

Figure 3D:
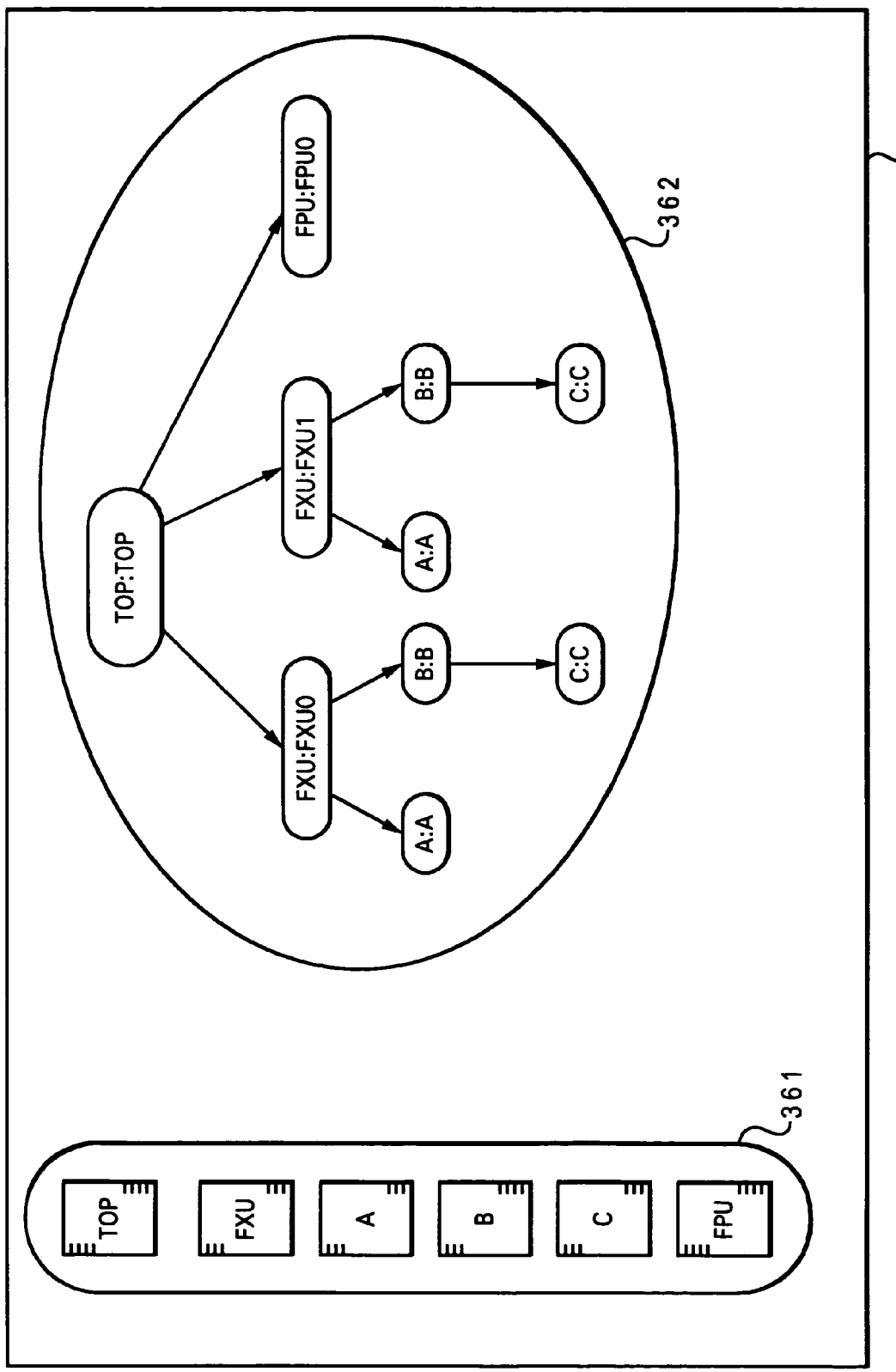
FIG. 3D is a block diagram depicting data structures that may be instrumental in accordance with a preferred embodiment of the present invention.

With reference now to FIG. 3D there is depicted a block diagram representing compiled data structures in which a preferred embodiment of the present invention may be implemented. Memory 44 contains proto data structures 361, one for each of the entities referred to in simulation model 329. In addition, instantiations in simulation model 329 are represented by instance data structures 362. Instance data structures 362 are connected by means of pointers indicating the hierarchical nature of the instantiations of the entities within simulation model 329. Model build tool 346 in FIG. 3C processes the contents of memory 44 into memory data structures in order to produce simulation executable model 348.

In order to instrument simulation models, the present invention makes use of entities known as "instrumentation entities," which are in contrast to the entities constituting a design which are referred to herein as "design entities". As with design entities, instrumentation entities are described by one or more HDL source code files and consist of a number of signal ports, a body section, and an entity name. In what follows, it will be assumed that an instrumentation entity is described by a single HDL file. Those skilled in the art will appreciate and understand extensions necessary to practice the current invention for an instrumentation entity that is described by multiple HDL files. Each instrumentation entity is associated with a specific design entity referred to hereinafter as the "target entity".

Figure 4A:
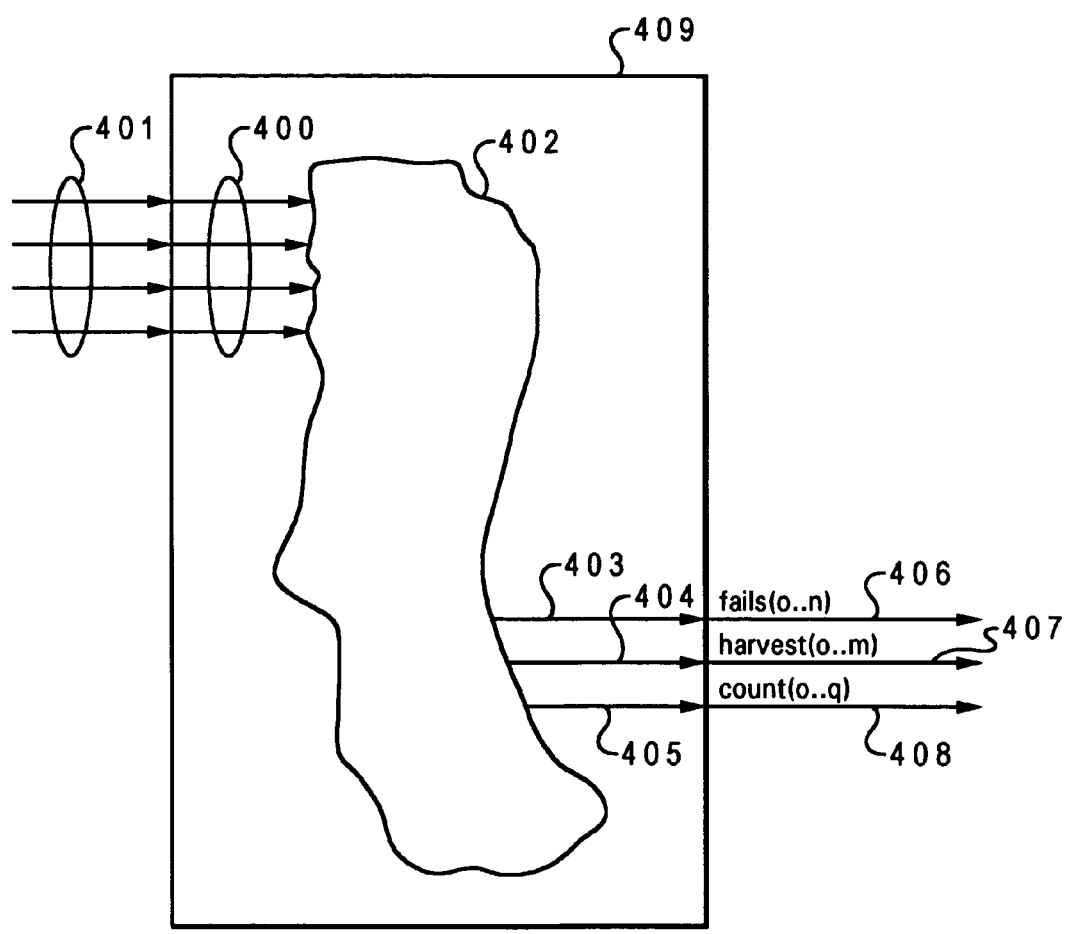
FIG. 4A is a simplified block diagram representative of an instrumentation entity utilized in a preferred embodiment of the present invention.

With reference now to FIG. 4A, there is illustrated a block diagram representation of an instrumentation entity 409. Instrumentation entity 409 includes a number of input ports 400 that are connected to signals 401 within a target entity (not depicted in FIG. 4A). A body section 402 contains logic necessary to detect occurrences of specified conditions within the target entity and generate simulation model "events" with respect to signals 401. A preferred embodiment of the present invention provides for generating three distinct types of events: "count" events, "fail" events, and "harvest" events, each described below in turn. Body section 402 contains internal logic for detecting occurrences of conditions precipitating generation of these events. A set of multi-bit output ports 403, 404, and 405 are connected to external instrumentation logic (depicted in FIG. 4B) by means of external signals 406, 407, and 408. Output ports 403, 404, and 405 thus provide the connection from the internal logic in body section 402 to the external instrumentation logic which is utilized to indicate the occurrence of count, failure and harvest events.

A failure event is a sequence of signal values that indicate a failure in the correct operation of the simulation model. Each instrumentation entity monitors the target entity for any desired number of failure events. Each occurrence of a failure event is assigned to a particular signal bit on output port 403. Logic within body section 402 produces an active high pulse on a specified bit of signal 403 when a failure condition is detected. Such activation of signal 403 is defined as a failure event. This error indication is conveyed by means of external signal 406 to external instrumentation logic (depicted in FIG. 4B as external instrumentation logic block 420), which flags the occurrence of the failure event.

A count event is a sequence of signal values that indicate the occurrence of an event within a simulation model for which it would be advantageous to maintain a count. Count events are utilized to monitor the frequency of occurrence of specific sequences within a simulation model. Each instrumentation entity can monitor the target entity for any desired number of count events. Each count event is assigned to a particular signal bit on output port 405. Logic block 402 contains the logic necessary to detect the occurrence of the desired count events, and in a preferred embodiment of the present invention, produces an active high pulse on the specified bit of signal 405 when a count event is detected. This count indication is conveyed by means of external signal 408 to instrumentation logic, which contains counters utilized to record the number of occurrences of each count event.

The third event type, a harvest event, is a sequence of signal values that indicate the occurrence of a specific operative circumstance, which would be advantageous to be able to reproduce. When a harvest event occurs, a register within an external instrumentation logic block is loaded to indicate at what point within a simulation run the event occurred, and a flag is set to indicate the occurrence of the specific circumstance. The details of the simulation run can thus be saved in order to recreate the specific circumstance monitored by the harvest event. Logic block 402 contains the logic necessary to detect the harvest events.

Each instrumentation entity can detect any desired number of harvest events that are each assigned to a particular signal bit on output port 404. Logic within block 402 produces an active high pulse on the specified bit of signal 404 when a harvest event is detected. This harvest event detection is conveyed by means of external signal 407 to external instrumentation logic that contains a register and flag for each harvest event. The register is utilized to record at which point in the simulation run the harvest event occurred, and the flag is utilized to indicate the occurrence.

Figure 4B:
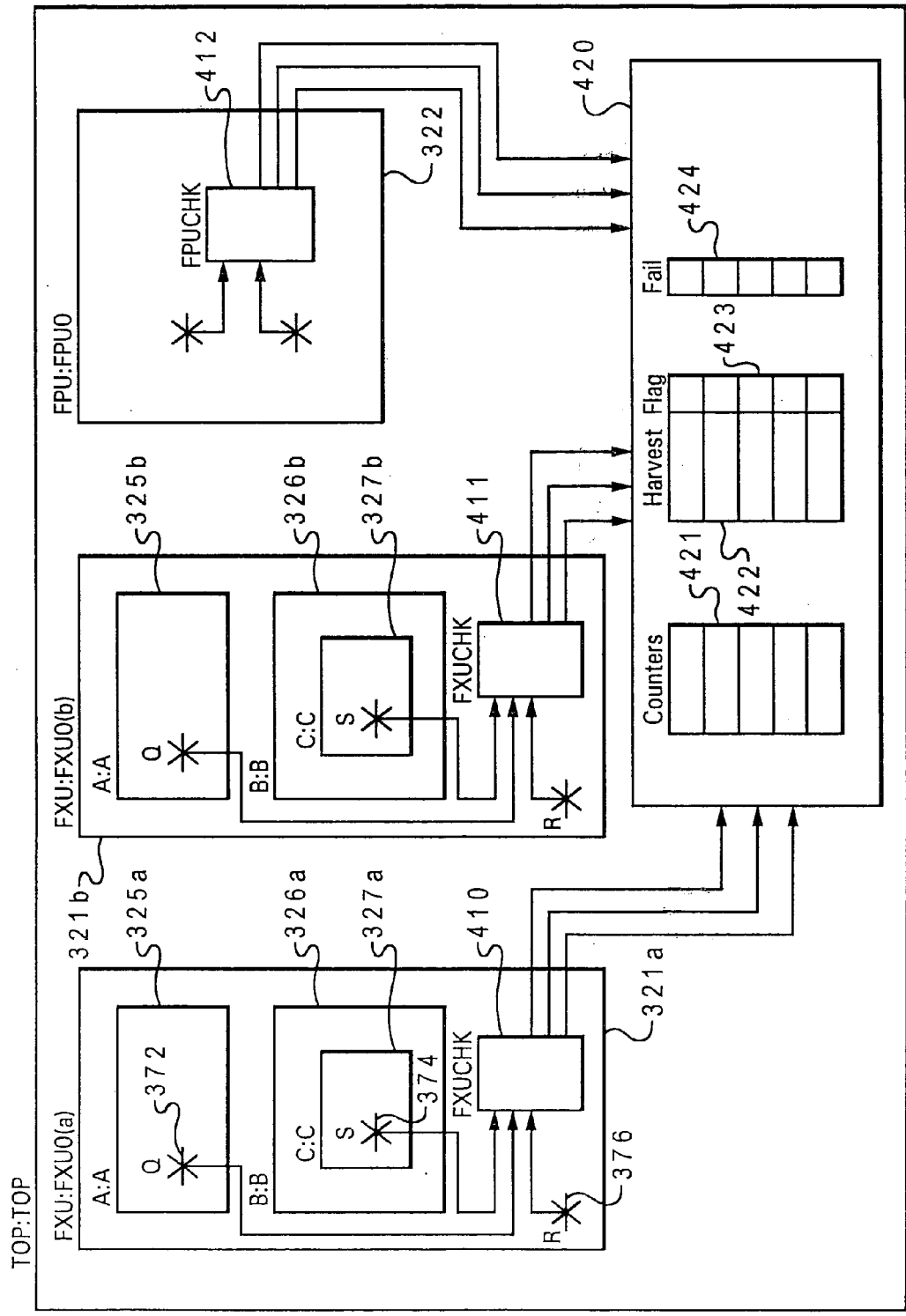
FIG. 4B is a simplified block diagram of a simulation model instrumented in accordance with the teachings of the present invention.

With reference now to FIG. 4B, wherein is depicted a block diagram representation of simulation model 329 instrumented in accordance with the teachings of the present invention. As can be seen in FIG. 4B, an instance 410 and an instance 411 of an instrumentation entity FXUCHK are utilized to monitor instances 321a and 321b of an FXU entity. For each FXU instantiations of 321a and 321b, an FXUCHK instantiation, 410 and 411 respectively, is automatically generated by the mechanism of the present invention. In a similar fashion, instrumentation entity FPUCHK 412 is instantiated to monitor FPU entity 322.

As depicted in FIG. 4B, entity FXUCHK monitors a signals Q 372, a signal R 376, and a signal S 374 within each of instances 321a and 321b of the FXU entity. Signal Q 372, is a signal within the instances 325a and 325b of descendant entity A. Likewise, signal S 374 is a signal within descendant entity C that resides within descendant entity B. Finally, signal R 376 occurs directly within FXU entity 321. Although an instrumentation entity may monitor any signal within a target entity or the target entity's descendent entities, signals outside the target entity cannot be monitored.

Each instrumentation entity is connected by means of fail, count, and harvest signals to instrumentation logic block 420 containing logic for recording occurrences of each of the three event types. For the count events monitored in simulation model 329, a set of counters 421 is utilized to count the number of occurrences of each count event. In a similar manner, a set of flags 424 is utilized to record the occurrence of failure events. Finally, a set of counters 422 and flags 423 are combined and utilized to record the point at which a harvest event occurs and its occurrence, respectively. In one embodiment of the present invention, a cycle number is captured and stored utilizing counters 422 and flags 423 to record a harvest event.

To facilitate instantiation and connection of instrumentation entities, instrumentation entity HDL source code files include a specialized comment section, hereinafter referred to as "instrumentation entity description", that indicates the target entity, the signals within the target entity to be monitored, and information specifying types of events to be monitored.

With reference now to FIG. 4C, there is illustrated an exemplary HDL file 440 that describes instrumentation entity FXUCHK depicted in FIG. 4B. HDL file 440 utilizes the syntax of the VHDL hardware description language. In the VHDL language, lines beginning with two dashes, "--", are recognized by a compiler as being comments. The method and system of the present invention utilize comments of a non-conventional form to indicate information about an instrumentation entity. FIG. 4C depicts one embodiment of the present invention in which comments begin with two exclamation points in order to distinguish these comments from conventional comments in instrumentation HDL file 440. It will be appreciated by those skilled in the art that the exemplary syntax utilized in FIG. 4C for the provision of unconventional comments is but one of many possible formats.

Within HDL file 440, the I/O ports of a FXUCHK entity are declared in entity declaration 450. Within entity declaration 450, three input ports, S_IN, Q_IN, and R_IN, respectively, are declared. Input ports, S_IN, Q_IN, and R_IN, will be attached to signal S, 374, signal Q, 372, and signal R, 376 respectively as described below. Input port, CLOCK, is also declared and will be connected to a signal, CLOCK, within the FXU entity. In addition, three output ports: fails (0 to 1), counts(0 to 2), and harvests(0 to 1), are declared. These output ports provide failure, count, and harvest signals for two failure events, three count events, and two harvest events. In a preferred embodiment of the present invention, the names of the output ports are fixed by convention in order to provide an efficient means for automatically connecting these signals to instrumentation logic block 420.

A set of instrumentation entity descriptors 451 are utilized to provide information about the instrumentation entity. As illustrated in FIG. 4C, descriptor comments 451 may be categorized in a number of distinct sections: prologue and entity name declaration 452, an input port map 453, a set of failure message declarations 454, a set of counter declarations 455, a set of harvest declarations 456, and an epilogue 457.

The prologue and entity name 452 serve to indicate the name of the particular target entity that the instrumentation entity will monitor. Prologue and entity name declaration 452 also serves as an indication that the instrumentation entity description has begun. Specifically, the comment "--!! Begin" within prologue and entity name 452, indicates that the description of an instrumentation entity has begun. The comment "--!! Design Entity: FXU" identifies the target entity which, in HDL file 440, is design entity FXU. In a preferred embodiment of the present invention, this declaration serves to bind the instrumentation entity to the target entity.

Input port map 453 serves as a connection between the input ports of an instrumentation entity and the signals to be monitored within the target entity. The comments begin with comment "--!! Inputs" and end with comment "--!! End Inputs". Between these comments, comments of the form "--!! inst_ent_port_name=>trgt_ent_signal_name" are utilized, one for each input port of the instrumentation entity, to indicate connections between the instrumentation entity ports and the target entity signals. The inst_ent_port_name is the name of the instrumentation entity port to be connected to the target entity signal. The trgt_ent_signal_name is the name of the signal within the target entity that will be connected to the instrumentation entity port.

In some cases a signal to be monitored lies within a descendant of a target entity. This is the case for signal S 374, which is embedded within entity C which is a descendant of entity B 326 and target FXU entity 321. Input port map 453 includes an identification string for signal S 374 which consists of the instance names of the entities within the target entity each separated by periods ("."). This identification string is pre-pended to the signal name. The signal mapping comment within input port map 453 for signal S 374 is therefore as follows:

--!!S_IN=>B.C.S

This syntax allows an instrumentation entity to connect to any signal within the target entity or the target entity's descendant entities. A signal appearing on the top level of the target design entity, has no pre-pended entity names; and therefore, has the following signal mapping comment:

--!!R_IN=>R

For signals on the top level of the target entity, a special connection method is provided. If the signal to be connected to has the same name as its corresponding signal in the port map of the instrumentation entity, no input port mapping comment is required and the signal will be automatically connected if no such comment is present. In other words, if the input port mapping comment is of the form:

--!! signal=>signal where signal is a legal signal name without periods ("."), then the input port mapping comment is not required and the system of the present invention will automatically make the connect. It is also possible to provide comments of the form given above to explicitly denote the signal connection. This mechanism is only operative for signals on the top level of the target entity.

Failure message declarations 454 begin with a comment of the form "--!! Fail Outputs;", and end with a comment of the form "--!! End Fail Outputs;". Each failure event output is associated with a unique event name and a failure message. This message may be output by the simulation runtime environment upon detecting a failure event. The unique failure event name is utilized to identify the specific failure event within the model. Each failure event signal may be declared by a comment of the form "--!! n: <eventname> "failure message";" where n is an integer denoting the failure event to which the message is associated, <eventname> is the unique failure event name, and "failure message" is the message associated with the particular failure event. One, and only one failure message declaration comment must be provided for each failure event monitored by the instrumentation entity.

Counter declaration comments 455 begin with a comment of the form "--!! Count Outputs;", and end with a comment of the form "--!! End Count Outputs;". Each count event output is associated with a unique variable name. This name is associated with a counter in counter logic 421 FIG. 4B. The variable name provides a means to identify and reference the particular counter associated with a particular count event. Thus, a comment of the form "--!! n: <varname> qualifying_signal [+/−];" is associated with each counter event output. Within this convention, n is an integer denoting which counter event in the instrumentation module is to be associated with a variable name "varname," and qualifying_signal is the name of a signal within a target design entity utilized to determine when to sample the count event pulse as will be further described hereinbelow. The parameter "qualifying_signal" is followed by "+/−" to specify whether the qualifying signal will be a high active qualifying signal or a low active qualifying signal.

Harvest declarations 456 begin with a prologue comment of the form "--!! Harvest Outputs;" and end with a comment of the form "--!! End Harvest Outputs;". Each harvest event output is associated with a unique event name and a message that may be output by the simulation runtime environment when a harvest event has occurred during a simulation run. Each harvest event signal is declared in the form "--!! n: <eventname> "harvest message";" where n is an integer denoting which harvest event the message is to be associated with, <eventname> is the unique harvest event name and "harvest message" is the message to be associated with the particular harvest event. One, and only one, harvest message declaration comment must be provided for each harvest event monitored by the instrumentation entity.

Harvest messages and event names, fail messages and event names, and counter variable names for a simulation model are included in a simulation executable model and lists of all the events within the model are produced in separate files at model build time. In this manner, each simulation model includes the information for each event monitored and a separate file containing this information for each event is available. Furthermore, as will be described below, the model build process names each event within the model (count, fail and harvest) model in such a manner as to insure that each event has a unique name with certain useful properties.

Finally, epilogue comment 457 consists of a single comment of the form "--!! End;", indicating the end of descriptor comments 451. The remainder of instrumentation entity HDL file 440 that follows the I/O declarations described above, is an entity body section 458. In entity body section 458, conventional HDL syntax is utilized to define internal instrumentation logic necessary to detect the various events on the input port signals and convey these events to the output port signals.

In addition to descriptor comments 451, that are located in the HDL source code file for an instrumentation entity, an additional comment line is required in the target entity HDL file. A comment of the form "--!! Instrumentation: name.vhdl", where name.vhdl is the name of the instrumentation entity HDL file, is added to the target entity HDL source code file. This comment provides a linkage between the instrumentation entity and its target entity. It is possible to have more than one such comment in a target entity when more than one instrumentation entity is associated with the target entity. These HDL file comments will hereinafter be referred to as "instrumentation entity instantiations".

Figure 4D:
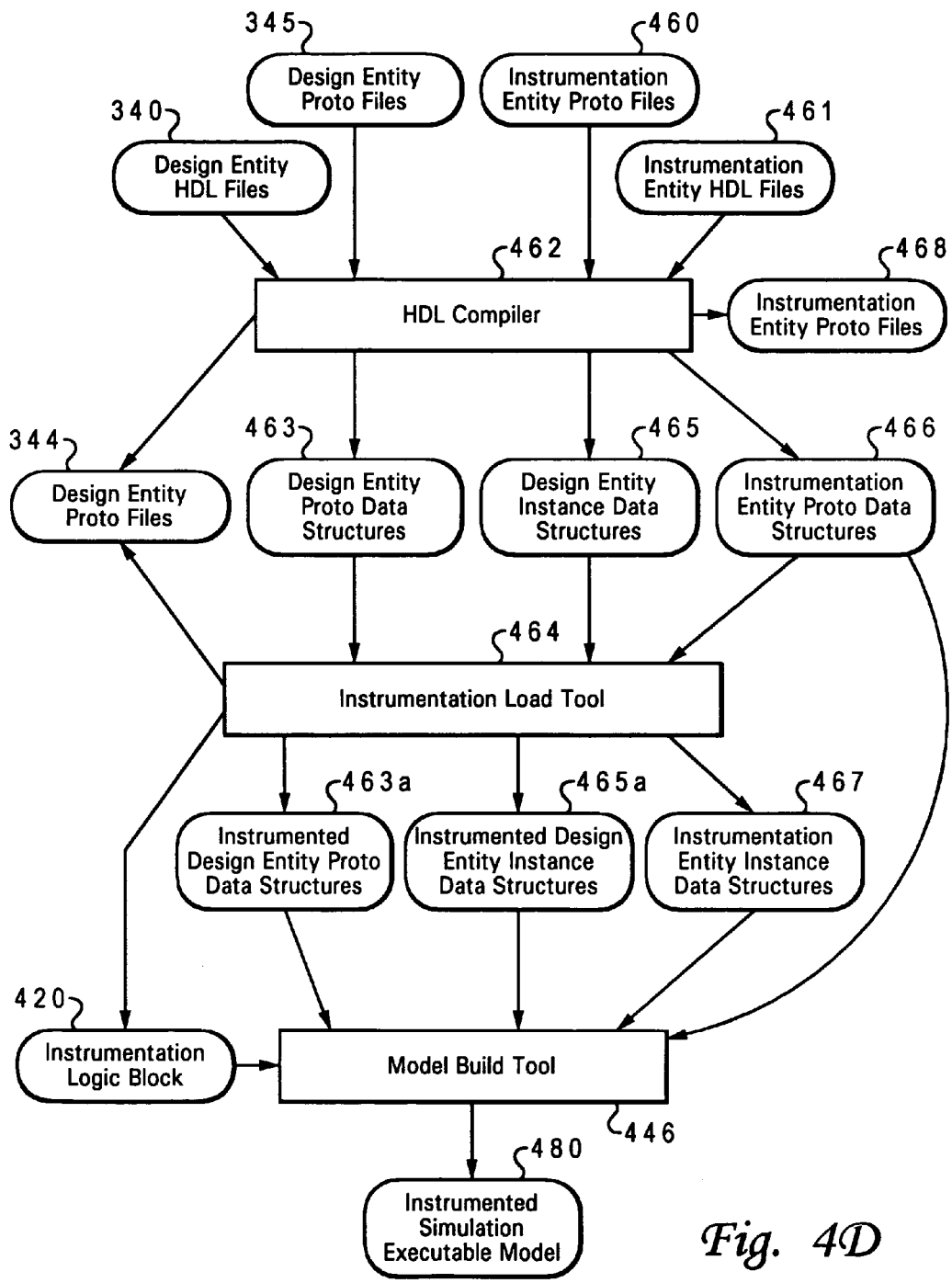
FIG. 4D is a flow diagram depicting a model build process in accordance with the teachings of the present invention.

With reference now to FIG. 4D, there is depicted a model build process in accordance with the teachings of the present invention. In this model build process, instrumentation load tool 464 is utilized to alter the in-memory proto and instance data structures of a simulation model thereby adding instrumentation entities to the simulation model. Instrumentation load tool 464 utilizes descriptor comments 451 within instrumentation HDL files 461 to create instance data structures for the instrumentation entities within a simulation model.

The model build process of FIG. 4D begins with design entity HDL files 340 and, potentially, one or more design entity proto files 345 (available from a previous run of HDL compiler 462), instrumentation entity HDL files 460, and potentially, one or more instrumentation entity proto files 461 (available from a previous run of HDL compiler 462). HDL compiler 462, processes design entity HDL files 340, and instrumentation entity HDL files 460 following an augmentation of algorithm process_HDL_file( ) that provides for efficient incremental compilation of the design and instrumentation entities comprising a simulation model. HDL compiler 462 loads proto data structures from design entity proto files 345 and instrumentation entity protos files 460, if such proto files are available and consistent. If such proto files are not available or are not consistent, HDL compiler 462 compiles design entity HDL files 340 and instrumentation entity HDL files 460 in order to produce design entity proto files 344 and instrumentation entity proto files 468. (design entity proto files 344 and instrumentation entity proto files 468 are available to serve as design entity proto files 345 and instrumentation entity proto files 460 respectively for a subsequent run of HDL compiler 462).

In addition, HDL compiler 462 creates in-memory design proto data structures 463 and design instance data structures 465 for the design entities of a simulation model. HDL compiler 462 also creates in-memory instrumentation proto data structures 466 for the instrumentation entities of a simulation model.

In order to minimize processing overhead HDL compiler 462 neither reads nor processes descriptor comments 451. However, HDL compiler 462 does recognize instrumentation entity instantiation comments within target entity HDL files. As such, HDL compiler 462 cannot create instance data structures instrumentation entity data structures 467. The creation of instance data structures requires interconnection information contained within descriptor comments 451 not processed by HDL compiler 462. HDL compiler 462 does, however, create instrumentation proto data structures 466.

The in-memory design proto data structures 463, design instance data structures 465, and instrumentation entity proto data structures 466, are processed by instrumentation load tool 464. Instrumentation load tool 464 examines design entity proto data structures 463 and design entity instance data structures 465 to determine those design entities that are target entities. In a preferred embodiment of the present invention, this examination is accomplished by utilizing a particular comment format as previously described.

All target entities that are loaded from design entity proto files 345 contain an instantiation for any associated instrumentation entity. Therefore, instrumentation load tool 464 merely creates an instance data structure 467 for any such instrumentation entity and passes, the unaltered design proto data structure 463 to instrumented design proto data structure 463a, and passes design instance data structure 465 to instrumented design instance data structure 465a.

If however, a target entity is loaded from design entity HDL files 340, rather than from design entity s proto files 345, instrumentation load tool 464 must alter its design proto data structure 463 and its design instance data structure 465 to instantiate an associated instrumentation entity. An instrumented design proto data structure 463a and instrumented design instance data structure 465a are thereby produced. In addition, instrumentation load tool 464 creates an instrumentation instance data structure 467 for each instrumentation entity associated with the current design entity.

The design entity proto data structures 463 that are altered by instrumentation load tool 464 are saved to disk 33 of computer system 10 as design entity proto files 344. Design entity proto files 344, which may include references to instrumentation entities, are directly loaded by a subsequent compilation of a simulation model, thus saving processing by instrumentation load tool 464 on subsequent recompilations unless an alteration is made to a design entity or an associated instrumentation entity.

In order for HDL compiler 462 to determine if alterations were made to either a target design entity or the target design entity's associated instrumentation entities, the BOM of a target design entity is expanded to include the HDL files constituting the instrumentation entities. In this manner, HDL compiler 462 can determine, by inspection of the BOM for a given design entity, whether to recompile the design entity and the design entity's associated instrumentation entities or load these structures from proto files 345 and 461.

Finally, instrumentation load tool 464 creates a unique proto and instance data structure for instrumentation logic block 420 and connects the fail, harvest, and count event signals from each instrumentation entity instantiation to instrumentation logic block 420. Model build tool 446 processes in-memory proto and instance data structures 463a, 465a, 467, 466 to produce instrumented simulation executable model 480

In HDL compiler 462, algorithm process_HDL_file( ) is augmented to allow for the incremental compilation of design and instrumentation entities. A pseudocode implementation of a main control loop of HDL compiler 462 is shown below:

```
process_HDL_file2(file, design_flag)                5
{                                                   10
    if (NOT proto_loaded(file) {                    15
        if (exists_proto_file(file) AND
            check_bom(file)) {                      20
            load_proto(file);                       25
        } else {                                    30
            parse_HDL_file(file)                    35
            for (all instances in file) {           40
                process_HDL_file2(instance,
                    design_flag);                   45
            }                                       50
            if (design_flag = TRUE) {               55
                for (all instrumentation
                    instances in file) {            60
                    process_HDL_file2(instance,
                        FALSE);                     65
                }                                   70
            }                                       75
            create_proto(file);                     80
            write_proto_file(file);                 90
        }                                           95
    }                                               100
    if (design_flag = TRUE){                        105
        create_instance(file);                      110
    }                                               115
}                                                   120
```

Algorithm process_HDL_file2( ) is an augmentation to process_HDL_file( ) of HDL compiler 342 in order to support the creation of instrumented simulation models. The algorithm is invoked with the name of the top level design entity passed through parameter file and a flag indicating whether the entity being processed is a design entity or an instrumentation entity passed through parameter design_flag (design_flag=TRUE for design entities and FALSE for instrumentation entities). Algorithm process_HDL_file2( ) (line 5) first checks, by means of routine proto_loaded( ) (line 15), if the proto for the current entity is already present in memory 44. If so, processing passes to line 105. Otherwise, control is passed to line 20 and 25 where disk 33 of computer system 10 is examined to determine if proto flies for the entity and its descendants (including instrumentation entities, if any) exist and are consistent. If so, the appropriate proto files are loaded from disk 10 by routine load_proto( ) (line 25) creating proto data structures, as necessary, in memory 44 for the current entity and the current entity's descendants including instrumentation entities.

If the proto file is unavailable or inconsistent, control passes to line 35 where the current entity HDL file is parsed. For any entities instantiated within the current entity, lines 40 to 55 recursively call process_HDL_file2( ) (line 5) in order to process these descendants of the current entity. Control then passes to line 55 where the design flag parameter is examined to determine if the current entity being processed is a design entity or an instrumentation entity. If the current entity is an instrumentation entity, control passes to line 80. Otherwise, the current entity is a design entity and lines 60 to 70 recursively call process_HDL_file2( ) (line 5) to process any instrumentation entities instantiated by means of instrumentation instantiation comments. It should be noted that algorithm process_HDL_file2( ) (line 5) does not allow for instrumentation entities to monitor instrumentation entities. Any instrumentation entity instantiation comments within an instrumentation entity are ignored. Control then passes to line 80 where proto data structures are created in memory 44 as needed for the current entity and any instrumentation entities. Control then passes to line 90 where the newly created proto data structures are written, as needed to disk 33 of computer system 10.

Control finally passes to line 105 and 110 where, if the current entity is a design entity, instance data structures are created as needed for the current entity and the current entity's descendants. If the current entity is an instrumentation entity, routine create_instance( ) (line 110) is not called. Instrumentation load tool 464 is utilized to create the in-memory instance data structures for instrumentation entities.

It will be apparent to those skilled in the art that HDL compiler 462 provides for an efficient incremental compilation of design and instrumentation entities. It should also be noted that the above description is but one of many possible means for accomplishing an incremental compilation of instrumentation entities. In particular, although many other options also exist, much, if not all, of the functionality of instrumentation load tool 464 can be merged into HDL compiler 462.

Figure 4E:
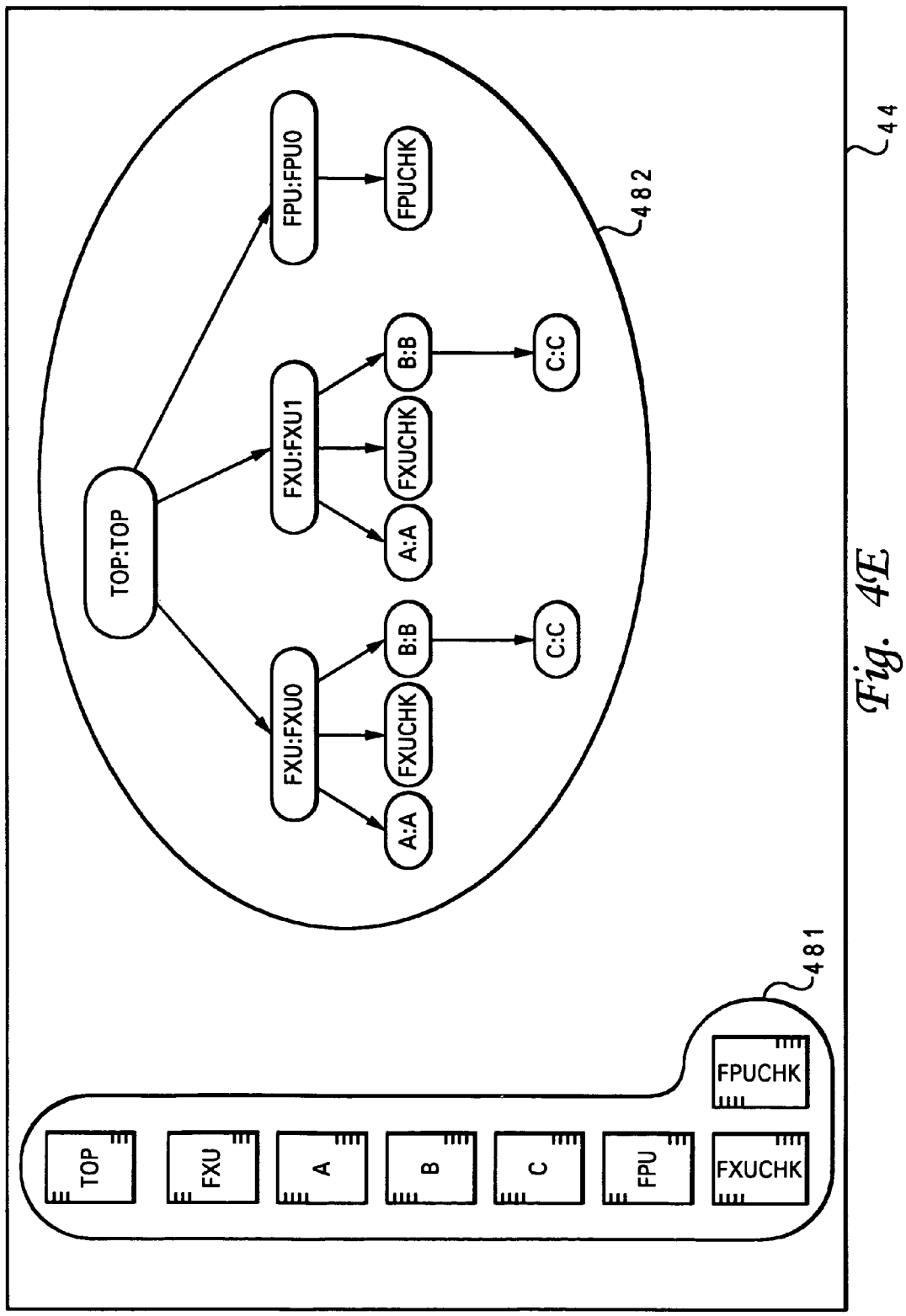
FIG. 4E is a block diagram representation of memory data structures constructed in accordance with the teachings of the present invention.

With reference now to FIG. 4E wherein is shown a depiction of memory 44 at the completion of compilation of simulation model 329 with instrumentation entities FXUCHK and FPUCHK. Memory 44 contains proto data structures 481, one for each of the design and instrumentation entities referred to in simulation model 329. In addition, design and instrumentation instances in simulation model 329 are represented by instance data structures 482. The instance data structures are connected by means of pointers indicating the hierarchical nature of the instantiations of the design and instrumentation entities within simulation model 329.

Figure 5A:
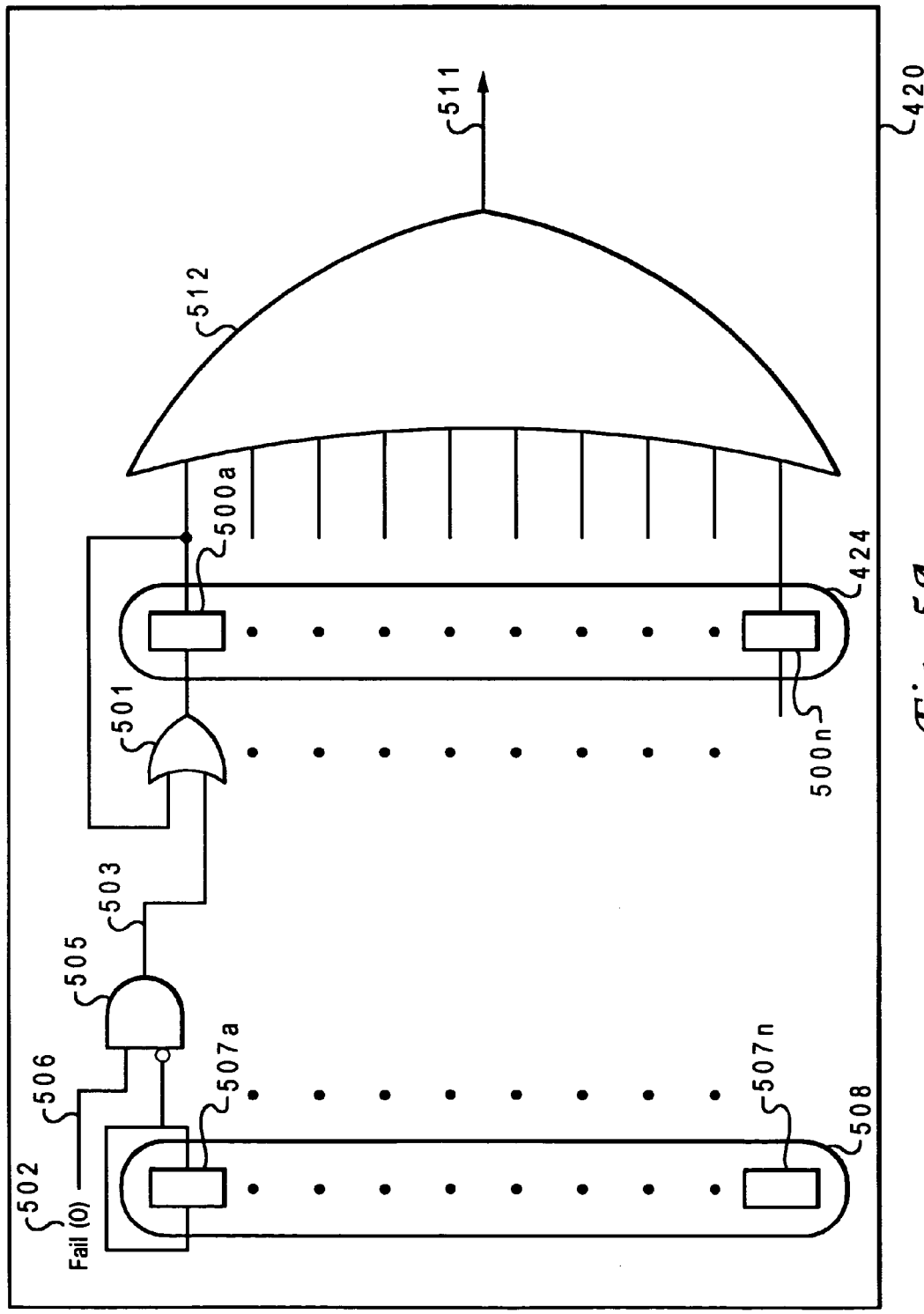
FIG. 5A is a logic diagram representation of a runtime disable mechanism in accordance with a preferred embodiment of the present invention.

With reference now to FIG. 5A, wherein is depicted failure flags 424 of instrumentation logic block 420 in greater detail. Failure flags 424 consist of registers 500a–500n utilized to accept and store an indication of the occurrence of a failure event. In what follows, the operation of a single failure flag for a particular failure event 502 will be discussed. The operation of all failure flags is similar.

Register 500a holds a value that represents whether a failure event 502 has occurred or not. Register 500a is initially set to a value of '0' by the simulation run-time environment at the beginning of a simulation run. When failure event 502, if enabled at register 507a, occurs, register 500a is set to a value of a logical '1', thereby indicating the occurrence of a failure event. Register 500a is driven by logical OR gate 501. Logical OR gate 501 performs a logical OR of the output of register 500a and a qualified failure signal 503 to create the next cycle value for register 500a. In this manner, once register 500a is set to a logical '1' by the occurrence of an enabled failure event, register 500a maintains the value of a logical '1' until reset by the simulation runtime environment. Likewise, register 500a maintains a value of '0' from the beginning of the simulation run until the occurrence of the failure event, if enabled.

Qualified failure signal 503 is driven by logical AND gate 505. Logical AND gate 505 produces, on qualified failure signal 503, the logical AND of failure signal 506 and the logical NOT of register 507a. Register 507a serves as an enabling control for qualified failure signal 503. If register 507a contains a value of '0', logical AND gate 505 will pass failure event signal 506 unaltered to qualified failure signal 503. In this manner, the monitoring of the failure event is enabled. Registers 507a–507n are set, by default, to a value of '0'. However, if register 507a contains a value of a logical '1', qualified failure signal 503 will remain at a value of '0' irrespective of the value of failure event signal 506, thereby disabling the monitoring of failure event 502. In this manner, register 508, consisting of registers 507a–507n, can mask the occurrence of any subset of failure events in the overall simulation model from registers 500a–500n.

To efficiently implement the ability to selectively disable the monitoring of failure events, the simulation run-time environment includes a function that allows a user to disable monitoring of a specific failure event for a given instrumentation entity. This function will automatically set the appropriate registers among registers 507a–507n within register 508 to disable the monitoring of a particular failure event for every instance of the instrumentation entity within the overall simulation model. Instrumentation load tool 464 and model build tool 446 encode sufficient information within instrumented simulation executable model 480 to determine which failure bits within register 508 correspond to which instrumentation entities.

The ability to selectively disable monitoring of failure events is of particular use in large batch-simulation environments. Typically, in such an environment, a large number of general purpose computers, running software or hardware simulators, are dedicated to automatically running a large number of simulation runs. If a simulation model with a faulty instrumentation entity that incorrectly indicates failure events is run in such an environment, a large number of erroneous failures will be generated causing lost time. By selectively disabling failure events within instrumentation entities, the present invention allows simulation to continue while only disabling erroneous failure signals rather than having to disable all failure monitoring. This option is particularly useful when the process of correcting a faulty instrumentation entity and creating a new simulation model is substantially time consuming. The present invention also provides similar enabling and disabling structures for the harvest and count events within a model.

Logical OR gate 512 is utilized to produce a signal, 511, that indicates whether any failure event within the model has occurred. This signal is utilized to allow hardware simulators to efficiently simulate simulation models that have been instrumented according to the teachings of the present invention.

Figure 5B:
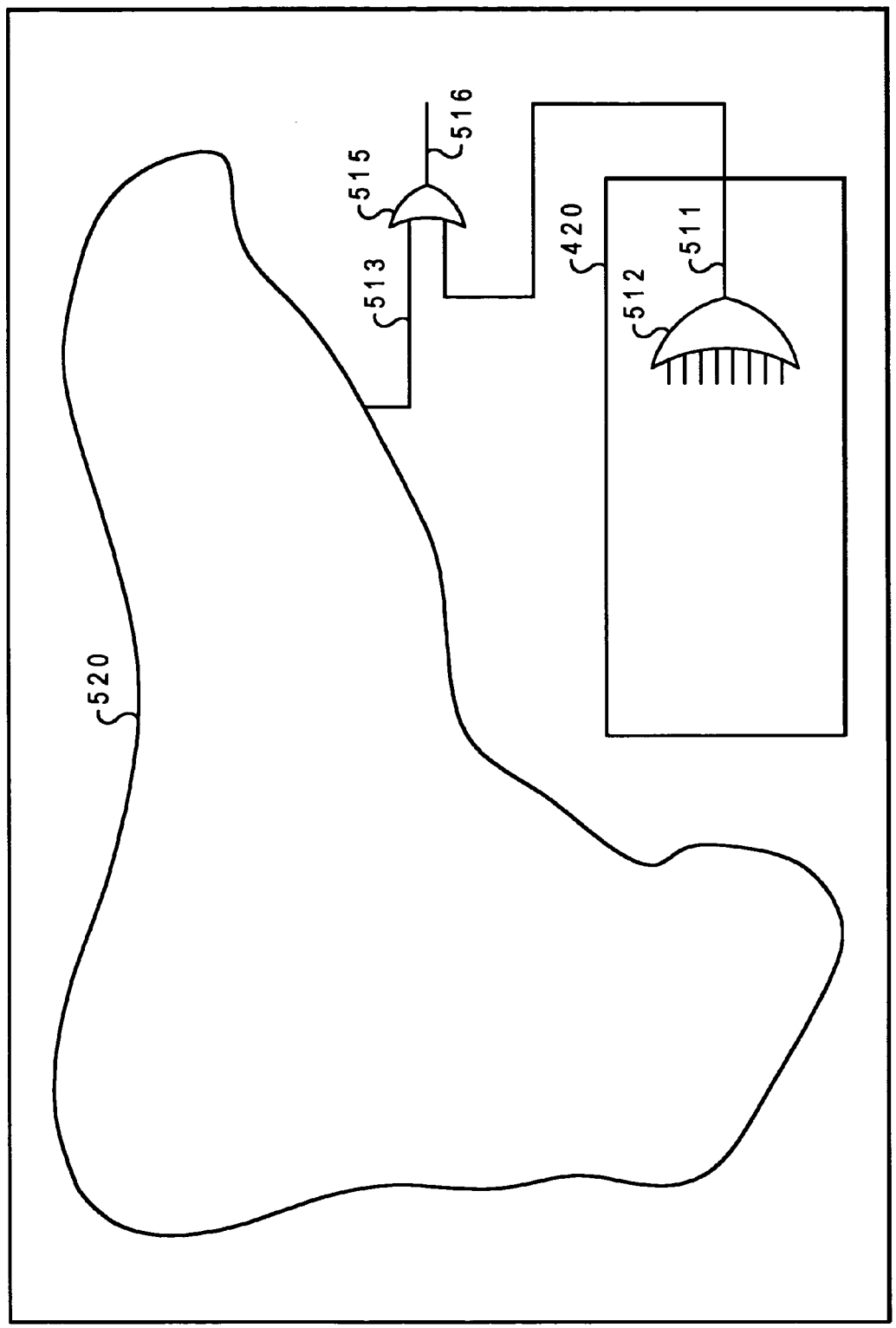
FIG. 5B is a block diagram representation of functional units utilized to execute the method and system of the present invention on a hardware simulator in accordance with the teachings of the present invention.

With reference now to FIG. 5B there is illustrated in greater detail, features of the present invention utilized to support efficient execution of an instrumented simulation model on a hardware simulator. It should be noted that for most hardware simulators, the operation of polling a facility within a simulation model during a simulation run is often a time consuming operation. In fact, if facilities must be polled every cycle, it is often the case that as much, if not considerably more, time is spent polling a simulation model for results rather than running the actual simulation. As such, it is advantageous when using a hardware simulator to avoid polling facilities within the model during a simulation run. In addition, many hardware simulators provide a facility that instructs the hardware simulator to run a simulation without interruption until a specific signal within the simulation model attains a specific value. This facility usually results in the highest performance for a simulation run on a hardware simulator.

In order to execute simulation model 520 on a hardware simulator, a termination signal 513, is typically utilized as a means to avoid having to poll the model after each cycle. Typically, a hardware simulator will cycle simulation model 520 until signal 513 is asserted to a logical '1'. The assertion of termination signal 513 to a logical '1' indicates that a simulation run has finished. Without termination signal 513, it would be necessary to directly poll facilities within simulation model 520 to determine when a simulation run is completed.

To efficiently locate and diagnose problems in simulation model 520, it is advantageous to allow a simulation run to be stopped immediately whenever a failure event occurs during simulation of simulation model 520 (harvest events and count events are typically only polled at the end of a simulation run). This allows a user to easily locate the failure event within the simulation run, thereby facilitating debugging of the failure. In order to allow simulation models that have been instrumented according to the teachings of the present invention to efficiently execute on a hardware simulator, a comment of the form "--!! Model Done: signalname" is placed within the HDL source code file for the top level entity of the simulation model where signalname is the name of termination signal 513 within the simulation model. This comment is only utilized if present in the HDL file for the top-level entity. If such a comment is present in the HDL source code file for the top level entity, a logical OR gate 515 will automatically be included within the simulation model. Logical OR gate 515 produces the logical OR of signals 511 and 513 on signal 516. Signal 516 is therefore asserted to a logically '1' whenever the simulation run has completed (signal 513 high) or a failure event has occurred (signal 511 high). Consequently, by executing simulation model 520 in a hardware simulator until signal 516 is asserted to a value of a logical '1', the instrumentation for simulation model 520 can be combined and utilized along with existing simulation termination techniques in a seamless manner. In the alternative, if the comment indicating the name of termination signal 513 is not present, logical OR gate 515 is not included in the model and signal 511 is directly connected to signal 516. The name of signal 516 is fixed to a particular name by convention.

In many simulators, the passage of time within the simulated model is modeled on a cycle-to-cycle basis. That is to say, time is considered to pass in units known as cycles. A cycle is delineated by the occurrence of a clock signal within a simulation model that regulates the updating of storage elements within the design. These simulators are commonly known as "cycle simulators". A cycle simulator models a digital design by repeatedly propagating the values contained within storage elements through interconnecting logic that lies between storage elements without specific regard for the physical timing of this propagation, to produce next cycle values within the storage elements. In such simulators, a primitive storage element, hereinafter referred to as a "simulator latch", is utilized to model the storage elements within a digital design. One simulator cycle therefore consists of propagating the current values of the simulator latches through the interconnecting logic between storage elements and updating the simulator latches with the next cycle value.

In many circumstances, however, it is not possible to utilize a single simulator latch to directly model the storage elements within a design. Many common storage elements utilized within digital designs often require more than one simulator latch. For example, so called master-slave flip-flops are generally modeled utilizing two simulator latches to accurately simulate the behavior of such storage elements. In order to efficiently model storage elements, a designer will typically refer to a library that contains storage element simulation models for use in a design. These design storage elements are modeled by one or more simulator latches. Storage elements comprised of one or more simulator latches that are implemented within a design will be referred to hereinbelow as "design latches".

As a consequence of utilizing multiple simulator latches to model a design latch, the process of propagating the input of a design latch to its output, which constitutes a design cycle, often requires more than one simulator cycle. A single design cycle is thus defined as comprising the number of simulator cycles required to propagate a set of values from one set of storage elements to the next.

In other circumstances, a simulation model may consist of distinct portions that are clocked at differing frequencies. For example, a microprocessor core connected to a bus interface unit, may operate at a higher frequency and than the bus interface unit. Under these circumstances, the higher frequency portion of the design will require one or more simulator cycles, say N cycles, to simulate a single design cycle. The lower frequency portion of the design will require a multiple of N simulator cycles in order to simulate a design cycle for the lower frequency portion. This multiple is equal to the ratio of the frequency of the higher speed design portion to the frequency of the lower speed design portion. It is often the case that certain portions of the logic can be run at a number of differing frequencies that are selectable at the beginning of a simulation run. Such logic, with a run-time selectable frequency of operation, presents unique challenges for monitoring count events.

Figure 6A:
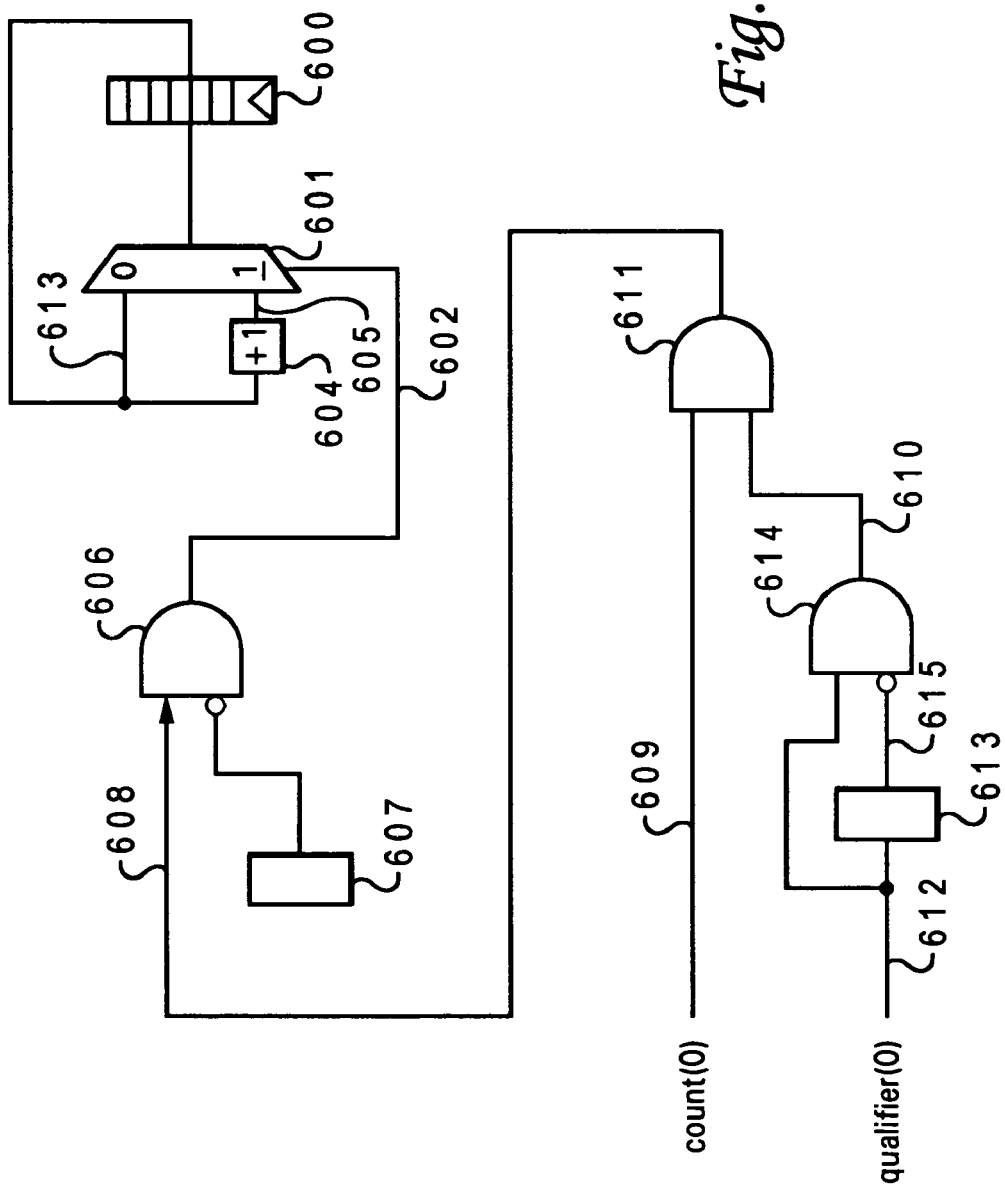
FIG. 6A is a simplified gate level representation of an exemplary counting instrument with a runtime disable feature and automatic clocking adjustment in accordance with the teachings of the present invention.

With reference now to FIG. 6A, there is depicted a gate level representation of exemplary logic for one counter of counters 421 within instrumentation logic block 420 depicted in FIG. 4B. Each counter of 421 is represented by a multi-bit simulator latch 600. Simulator latch 600 is initialized by the simulation runtime environment to a value of zero at the beginning of a simulation run. Simulator latch 600 is updated every simulator cycle and is driven by multiplexor 601. Multiplexor 601, controlled by selector signal 602, selects between signal 613, the current value of simulator latch 600, and signal 605, the current value of simulator latch 600 incremented by 1 by incrementor 604, to serve as the next cycle value for simulator latch 600. By selecting signal 605, multiplexor 601 causes the counter value within simulator latch 600 to be incremented when a count event occurs. It should be noted, however, that simulator latch 600 is updated every simulator cycle irrespective of the number of simulator cycles that correspond to a design cycle for the logic being monitored by a counting instrument. Logical AND gate 606 and simulator latch 607 serve to disable the monitoring of count event signal 609 in a manner similar to that described above for the disabling of failure events. Signal 608 is count event signal 609 further qualified by signal 610 by means of logical AND gate 611.

Signal 610 insures that simulator latch 600 will be incremented, if count event signal 609 is active, only once per design cycle for the logic being monitored by a counting instrument irrespective of the number of simulation cycles utilized to model the design cycle. This clocking normalization is necessary to ensure that the event counts recorded in counters 421 correspond directly to the number of design cycles the event occurred in and not the number of simulator cycles the event occurred in. For example if an event occurs in two design cycles where design cycle require four simulators cycles, it is preferable to have the event counter reflect a value of two rather than a value of eight as would occur if the counter were allowed to update in every simulator cycle.

Furthermore, if the count event being monitored is within a portion of the logic with a run-time selectable frequency of operation, it is useful to have the count registers reflect the number of occurrences of the event in terms of design cycles. For example, consider a circumstance where a count event occurs twice during two different simulation runs. In the first run, assume that four simulator cycles are needed to represent each design cycle. Further assume in the second run that twelve simulator cycles are necessary to represent each design cycle. Without a clocking normalization mechanism, the first run would indicate that the event occurred eight times (two occurrences times four simulator cycles per occurrence) and the second run would indicate that the event occurred twenty-four times (two occurrences times twelve simulator cycles per occurrence) when in fact the event actually only occurred twice in both simulation runs. Therefore, it would be advantageous to limit the updating of counters 421 such that each counter is only updated once per design cycle irrespective of the number of simulator cycles, possibly variable at run-time, needed to represent a design cycle.

In simulation models in which multiple simulator cycles are utilized to represent a single design cycle, explicit clocking signals are utilized within the model to control the updating of the various design storage elements. These clocking signals specify in which simulator cycles the simulator latches representing design storage elements are allowed to update. A clocking signal is asserted high for some contiguous number of simulator cycles either at the beginning or end of the design cycle and asserted low for the remaining simulator cycles within the design cycle. If the clocking signal is asserted high during the beginning of the design cycle, the clock is referred to as a "high-active" clock and, likewise, if the clocking signal is asserted low during the beginning of the design cycle, the clock is referred to as a "low-active" clock.

Each count event signal has an associated qualifying signal as specified by counter declaration comments 455 as described above. Typically, these qualifying signals are connected to the clocking signals within the design responsible for updating the storage elements within the portion of logic monitored by the count event. The qualifying signal for the count event for simulator latch 600, qualifying signal 612, is depicted as a high-active qualifier signal. Qualifying signal 612 is processed by simulator latch 613 and logical AND gate 614, to produce signal 610 which is active high for one and only one simulator cycle within the design cycle delineated by qualifying signal 612.

Figure 6B:
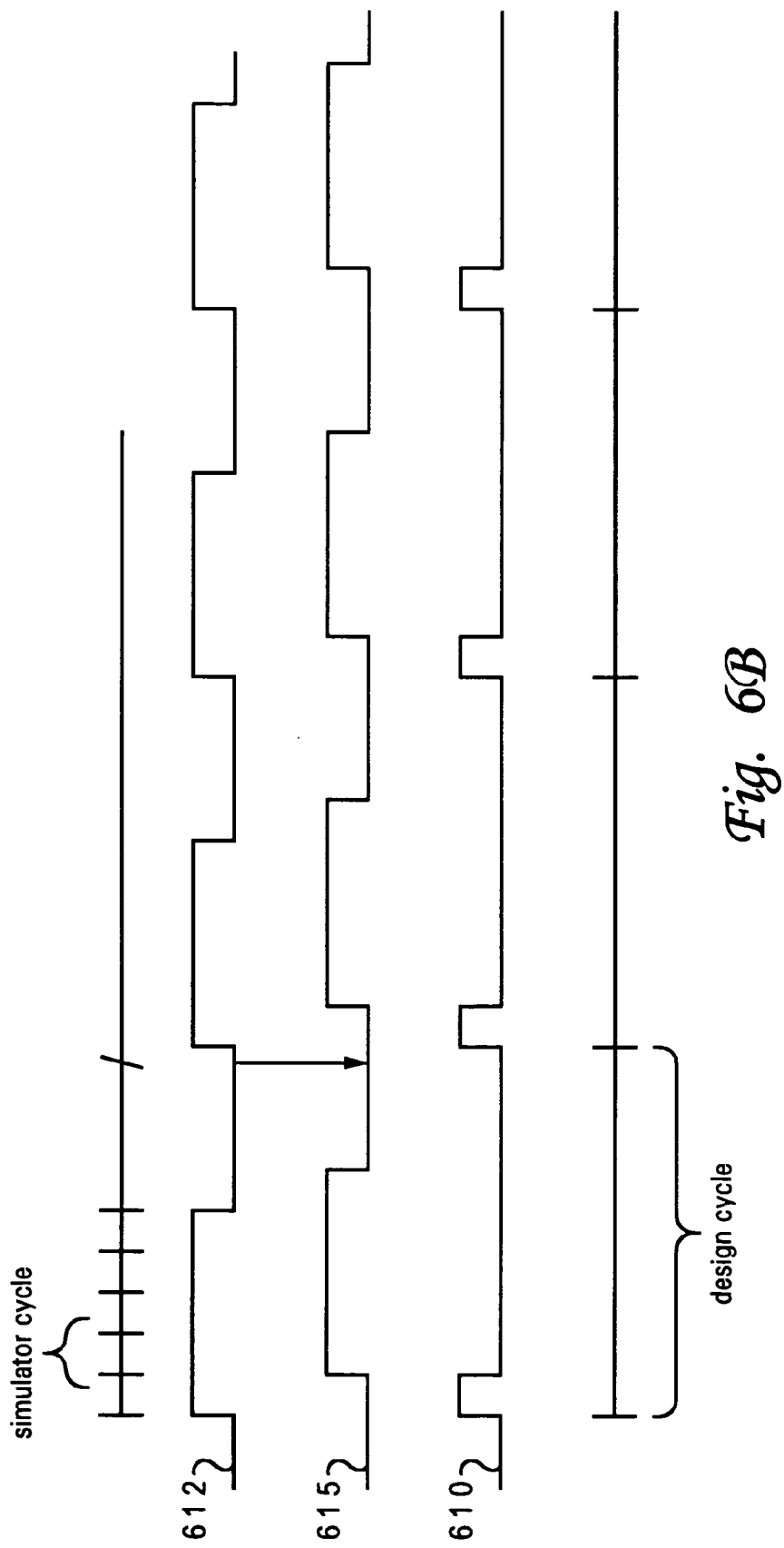
FIG. 6B is a simplified timing diagram illustrating automatic clocking adjustment of counting instrumentation in accordance with a preferred embodiment of the present invention.

Turning now to FIG. 6B there is illustrated a simplified timing diagram that demonstrates operation of simulator latch 613 and logical AND gate 614 assuming clocking qualifying signal 612 is a high active clocking signal of fifty percent duty cycle for a design cycle that occurs over a 10-simulation cycle period. Signal 615, the output of simulator latch 613, is qualifying signal 612 delayed by one simulator cycle. Signal 615 is inverted and logically ANDed with qualifying signal 612 to produce signal 610, a high-active pulse that is asserted for the first simulator cycle of the design cycle. In a similar fashion, if the qualifying clock signal is low active, qualifying signal 612 would be inverted and signal 615 would be uninverted by logical AND gate 614. This would produce a single simulator cycle active high pulse during the first simulator cycle of the design cycle. Qualifying signal 610, by qualifying count event signal 609 by means of logical AND gate 611, insures that counter 600 is incremented only once per design cycle irrespective of the number of simulator cycles utilized to represent a design cycle.

In contrast to cycle simulators, another class of simulators know as "event-driven" simulators is commonly utilized. In an event driven simulator, time is modeled in a more continuous manner. Each rising or falling edge of a signal or storage element within a design is modeled with specific regard to the physical time at which the signal transition occurred. In such simulators, the simulator latches operate in a slightly different manner than for a cycle based simulator. A simulator latch in an event driven simulator is controlled directly by a clocking signal. A new value is loaded into the simulator latch on either the rising or falling edge of the clocking signal (called a "positive-edge triggered" latch and a "negative-edge triggered" latch respectively). To practice the current invention within an event driven simulator, latch 613 and logical gates 614 and 611 are unnecessary. Rather, counter latch 600 is replaced by a positive or negative edge triggered simulator latch based on the polarity of qualifying signal 612. Qualifying signal 612 is connected directly to simulator latch 600 and directly controls the updates of counter latch 600 insuring that the latch is updated only once per design cycle.

Returning to FIG. 6A, incrementor 604 represents but one possible mechanism that may be utilized to implement the next logic state for a given counter within the present invention. As depicted in FIG. 6A, incrementor 604 ensures that counters 421 within a model are cycled through a series of values whose binary patterns correspond to the customary representation of non-negative integers. In one embodiment of the present invention, incrementor 604 is comprised of an adder that increments the current value of counter 600 by a unit value each time signal 605 is selected by selector signal 602. This exemplary implementation provides for convenience of decoding the value of counter 600 at the termination of a simulation run, but does so at a cost in overhead that is not acceptable in many simulators.

For software simulators, one of two basic approaches may be utilized to model an incrementor, such as incrementor 604. In the first approach, the incrementor is modeled directly by an ADD or INCREMENT instruction in the simulation execution model. When incrementors are modeled directly as a single instruction within the simulation execution model, the use of incrementor 604 provides for efficient counters within a simulation execution model.

However, many software simulators and virtually all hardware simulators model incrementor functions as a set of gates that are replicated essentially without change at each bit position of the counter. Within a software simulator, these gates must be translated into a sequence of instructions. In a hardware simulator, these gates are explicitly replicated for each counter as individual gates. Due to implementation or structural limitations, many software simulators are incapable of modeling an incrementor in any other manner than as a set of gates. Clearly, for these software simulators that must model incrementors as a number of gates and therefore as a sequence of instructions, a performance loss will result over those software simulators that model incrementors as a single increment or add instruction. Likewise, for hardware simulators, the number of gates required for each adder, which must be modeled directly by gates within the hardware simulator, can prove to be a significant burden.

The method and system of the present invention alleviate these difficulties by implementing a linear feedback shift register as the counting means within counting instrumentation. As explained below, appropriate configuration and utilization of such a liner feedback shift register results in an efficient method of incrementing a counter that avoids the overhead associated with incrementor 604.

Figure 7:
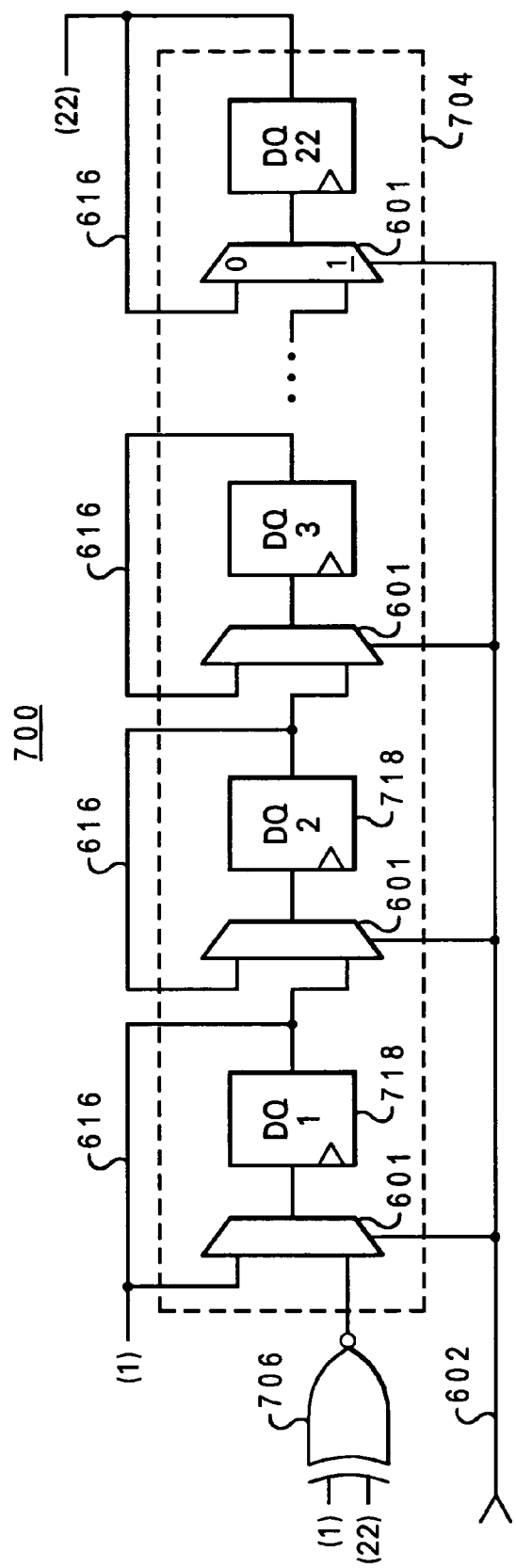
FIG. 7 depicts an alternative counting means that may be employed for counting events detected by instrumentation entities in accordance with the teachings of the present invention.

With reference now to FIG. 7, there is depicted a linear feedback shift register (LFSR) counter 700 consisting of a shift register 704 and "exclusive NOR" (XNOR) gate 706. Various methods of constructing LFSRs are known to those skilled in the art. As illustrated in FIG. 7, LFSR counter 700 includes a modified shift register 704 that may replace register 600 and incrementor 604 of FIG. 6A. LFSR counter 700 also includes multiplexor 601 (replicated bit-by-bit within LFSR 704) which provide feedback paths 616. Feedback path 616 provides a means for shift register 704 to maintain its current value during those simulator cycles in which no count pulse trigger (signal 602) is received. For hardware and software design simulators in which, for logistical or other reasons, incrementation of counters must be accomplished utilizing a set of gates for each counter, shift register 704 replaces register 600 within the counter logic depicted in FIG. 6A. The need for incrementor 604 is thus eliminated and is replaced by XNOR gate 706. In this manner, register 600 and incrementor 604 are replaced utilizing a more efficient logic structure having substantially reduced overhead. Counters 421 of FIG. 4B, will therefore consist of LFSR-based configurations such as LFSR counter 700 whose values can be decoded at the end of a simulation run to reveal their corresponding integral values.

Shift register 704 can be of any desired length. In a preferred embodiment, shift register 704 is a 20 bit register, although larger or smaller registers may be employed. Shift register 704 consists of latches 718 arranged in a serial fashion such that a given latch's output is utilized as input to the next latch 718 within shift register 704. In addition, a select subset of latches 718 within shift register 704 have their outputs sourced to XNOR gate 706. XNOR gate 706 is utilized to provide an input for the first latch within shift register 704.

The LFSR is a logic structure that, when properly configured, will sequence through all possible bit patterns with the exception of the all-ones pattern (it is possible to construct LFSRs which exclude the all-zeros pattern or LFSRs that cycle through all possible bit patterns). For example, in a 22 bit LFSR, bits 1 and 22 may be selected for inputs to XNOR gate 706 to provide a sequence of bit patterns in shift register 704 which traverses every possible permutation with the exception of the all-ones pattern. Shift register 704 must be loaded with an initial value that is not the all ones pattern. This may be accomplished automatically by initializing all latches to a binary zero value within the simulator, or by utilizing the control program that drives the simulator to explicitly set these latches to binary zeros.

After initialization, the numeric pattern held by bit positions 718 of shift register 704 will cycle through a specific and predictable pattern in a repeating fashion. That is to say, for any given bit pattern present in shift register 704, there is a specific, unique pattern the shift register will subsequently assume upon being shifted and therefore, the sequence of patterns through which the shift register cycles is fixed and repeats in a predictable manner. Due to these properties, LFSR counter 700 can be utilized as a counting means within for the instrumentation detection means previously described. By assigning the value of "zero" to a pre-selected starting value (say the all zeros pattern for shift register 704), the value of "one" to the next bit pattern formed by shifting the LFSR, and so on, the LFSR can serve as a counter. To be useful as a counter, the bit patterns within shift register 704 must be converted back to their corresponding integer values. This is easily accomplished for LFSRs with a small number of bits (less than 25 bits) by means of a lookup table consisting of an array of values, where the index of the array corresponds to the LFSR bit pattern value and the entry in the array is the decoded integer value for the LFSR. For LFSRs with a larger number of bits, software decoding techniques can be utilized to decode the LFSR value by simulating the operation of the LFSR.

As illustrated in FIG. 7, the logic necessary to implement LFSR counter 700 consists of the single XNOR gate 706 with two feedback inputs. While the number of required feedback gates and inputs thereto may vary in proportion to different possible lengths of an LFSR, in general, for typical LFSRs (less than 200 bits), only one XNOR gate with a relatively small number of inputs (less than 5 bits) is required. This is in marked contrast to the several logic gates per bit required for conventional incrementors. Therefore, significant savings in counter overhead can be achieved by substituting LFSR-based counter 700 for the incrementor structure depicted in FIG. 6A, especially for simulators that model incrementors utilizing logic gate based representations.

While the above described system and method provides a practical means of instrumenting simulation models, in certain circumstances additional techniques may be used in order to enhance the ease with which a user may instrument a simulation model. In design, it often occurs that there are common design or instrumentation logic constructs that are often repeated and possess a regular structure.

By utilizing knowledge of the regular structure of these design and instrumentation logic constructs, it is often possible to define a syntax that describes the instrumentation logic with considerably greater efficiency than would be possible utilizing a conventional HDL construct. By utilizing this syntax as an unconventional HDL comment within a design VHDL file, it is possible to create instrumentation entities with considerably greater ease and efficiency.

Such comments within a design entity will be referred to hereinbelow as an embedded instrumentation entity comment while the instrumentation logic created by such a comment will be referred to as an embedded instrumentation entity.

A common logic design construct is the so-called "finite state machine". A finite state machine typically consists of a number of storage elements to maintain the "state" of the state machine and combinatorial logic that produces the next state of the state machine and its outputs. These constructs occur with great frequency in typical logic designs and it is advantageous to be able to efficiently instrument these constructs.

A typical set of count and failure events for a finite state machine includes counting the number of times a state machine cycles from a given current state to some next state, counting the number of functional cycles the state machine spends in each state, ensuring that the state machine does not enter an illegal state, and ensuring that the state machine does not proceed from a current given state to an illegal next state. This list of events is but one of many possible sets of events that can be used to characterize a finite state machine and is used in an illustrative manner only.

Figure 8A:
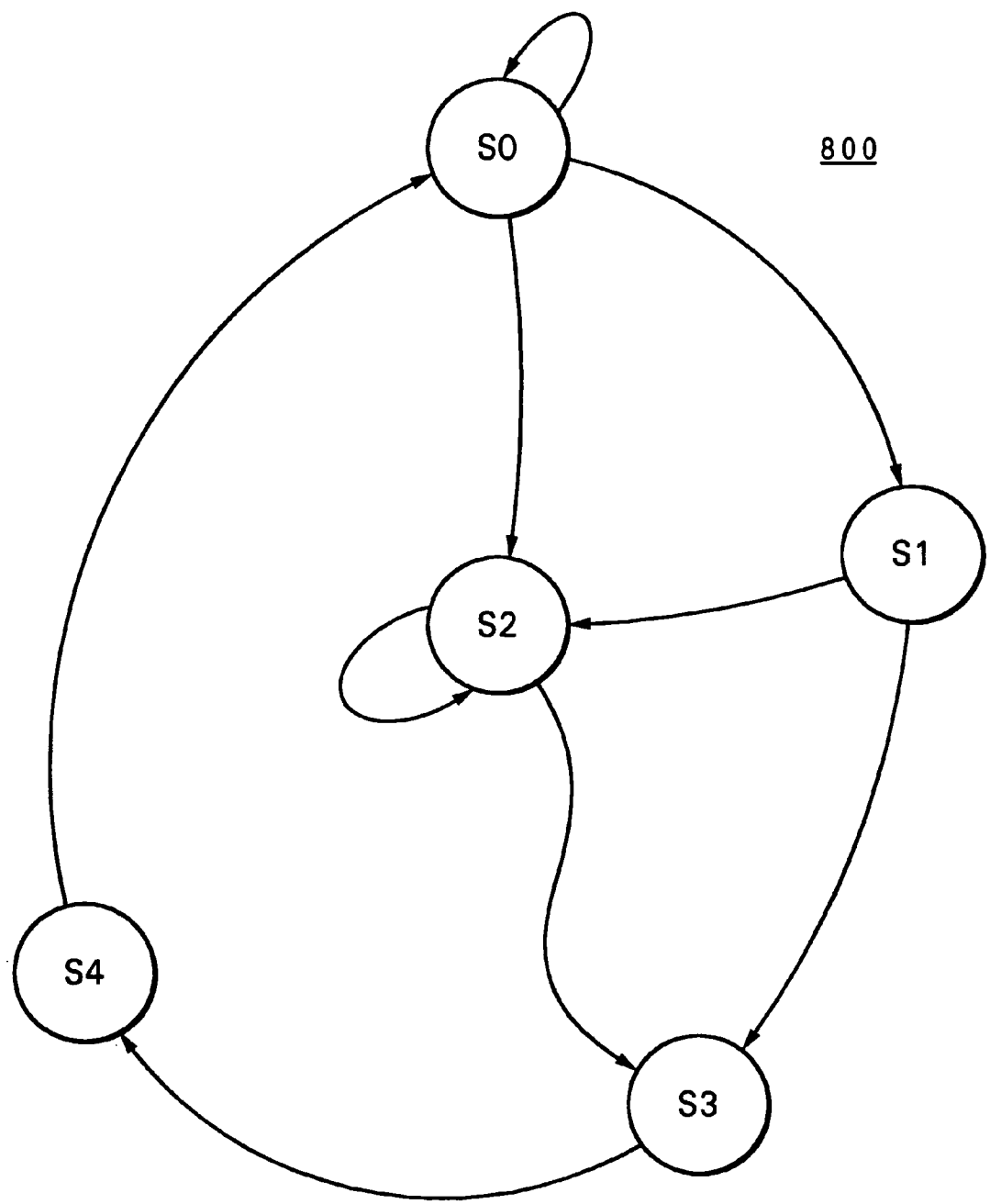
FIG. 8A illustrates a conventional finite state machine that may be instrumented with an embedded checker in accordance with the teachings of the present invention.

With reference now to FIG. 8A there is depicted a representation of an exemplary state machine 800. Exemplary state machine 800 consists of five states, labeled S0, S1, S2, S3, and S4 respectively, and nine legal state transitions between these states. In what follows, it is assumed that state machine 800 consists of three latches and a set of combinatorial logic to produce the next state function. It is further assumed that the states are encoded into the three latches following the usual and customary encoding for integers. That is to say, state S0 gets an encoding of $000_{bin}$, state S1 gets an encoding of $001_{bin}$, state S2 gets and encoding of $010_{bin}$, and so on.

Figure 8B:
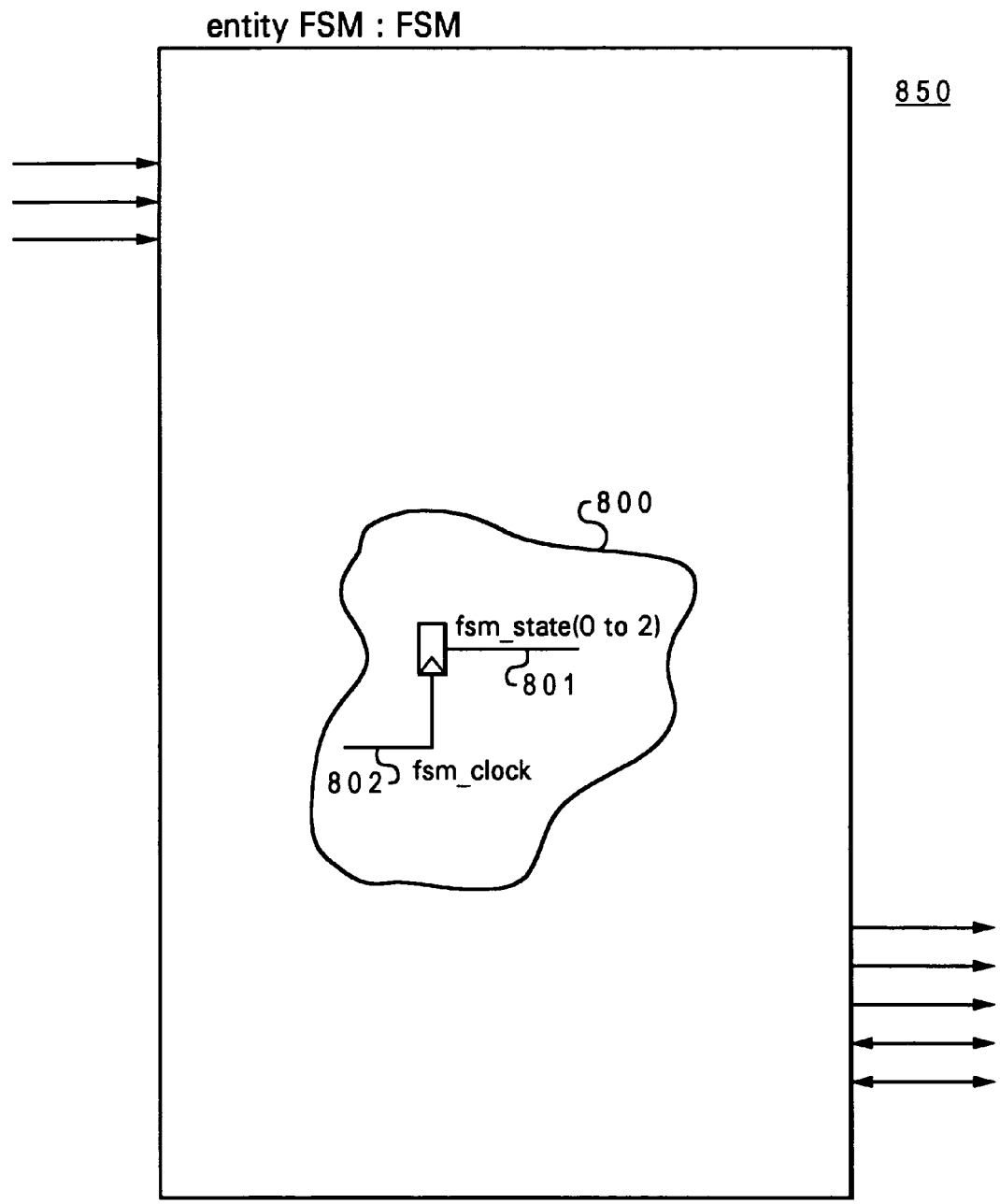
FIG. 8B depicts a conventional finite state machine design entity.

With reference now to FIG. 8B there is shown an exemplary design entity 850 referred to as entity FSM with instance name FSM, which contains one instance of state machine 800. Furthermore, a signal output 801, "fsm_state(0 to 2)" contains a three bit signal directly connected to the outputs of the three storage elements comprising the state elements of state machine 800. A signal input 802, fsm_clock, applies a clocking signal that controls the storage elements for state machine 800.

In order to instrument state machine 800, it would conventionally be necessary to create an instrumentation entity VHDL file containing the logic necessary to detect the desired state machine events and pass them through to count and fail events. Such an instrumentation entity file with appropriate instrumentation entity descriptor comments would typically require substantially more lines of code than the HDL description of the state machine itself. Such a circumstance is undesirable. However, in the case of a regular logic structure such as a finite state machine, it is possible to define a brief syntax that characterizes the finite state machine without resorting to a separate instrumentation VHDL entity.

With reference now to FIG. 8C there is illustrated an exemplary HDL file 860 for generating design entity 850 with an embedded instrumentation entity for monitoring the behavior of FSM 800. Specifically, an embedded instrumentation entity comment 852 is illustrated that conforms to a preferred embodiment of the present invention. As depicted in FIG. 8C, embedded instrumentation entity comment 852 comprises a number of distinct sections including: a prologue and embedded instrumentation name declaration 853, a state machine clock declaration 859, a state element declaration 854, a state naming declaration 855, a state element encoding declaration 856, a state machine arc declaration 857, and an epilogue 858.

Prologue and embedded instrumentation entity name declaration comment 853 serves to declare a name that is associated with this embedded instrumentation entity. This comment line also serves to delineate the beginning of an embedded instrumentation entity comment sequence.

As further depicted in FIG. 8C, declaration comment 853 assumes a non-conventional syntax of the form: "--!! Embedded TYPE: name", wherein "--!! Embedded" serves to declare an embedded instrumentation entity, "TYPE" declares the type of the embedded instrumentation entity—FSM in this case, and "name" is the name associated with this embedded instrumentation entity.

State machine clock declaration comment 859 is utilized to define a signal that is the clocking control for the finite state machine.

State element declaration comment 854 is utilized to specify the state-machine state storage elements. This comment declares the storage elements or signal names that constitute the state-machine state. In state machine 800, the signals fsm_state(0 to 2) constitute the state machine state information.

State naming declaration comment 855 is utilized to declare labels to associate with various states of the given state machine. These labels are utilized in state machine arc declaration comment 857 when defining the legal state transitions within the given state machine.

State element encoding declaration comment 856 is utilized to define a correspondence between the state machine labels defined by state naming declaration comment 855 and the facilities declared by state element declaration comment 854. In the example shown, the labels of comment 855 are associated by position with the encodings given in comment 856 (i.e., the state labeled "S0" has the encoding $000_{bin}$, the state labeled "S1" has the encoding $001_{bin}$, etc.)

State-machine arc declaration comment 857 defines the legal state transitions within the state machine. The various transitions of the state machine are given by terms of the form "X=>Y" where X and Y are state machine state labels given by comment 855 and X represents a previous state machine state and Y a subsequent state machine state.

Epilogue comment 858 serves to close the embedded instrumentation entity comment. The specific syntax and nature of the comments between the prologue and embedded instrumentation name declaration and the epilogue will vary with the specific needs of the type of embedded instrumentation entity being declared.

Embedded instrumentation entity comment 852 is inserted within the VHDL file of the design entity that contains the finite state machine in question. The embedding of instrumentation for finite state machine 800 is made possible by the non-conventional comment syntax illustrated in FIG. 8C and is substantially more concise than a conventional HDL instrumentation entity suitable for accomplishing the same function.

Utilizing such embedded non-conventional comments, the system of the present invention creates an instrumentation entity, as described below, for instrumenting the state machine without the need to resort to creating a separate HDL file instrumentation entity.

To support compilation and creation of embedded instrumentation entities, the previously described compilation process of FIG. 4D is enhanced as described herein. First, HDL compiler 462 is altered to recognize the presence of embedded instrumentation entity comments. If, during compilation of a design HDL file, and subject to the constraints described above for incremental compilation, HDL compiler 462 detects one or more embedded instrumentation entity comments within the source code file, HDL compiler 462 places a special marker into design entity proto data structure 463.

When instrumentation load tool 464 is passed control, proto data structures 463 are searched in order to locate the special marker placed by HDL compiler 462 indicating embedded instrumentation entity comments. Such protos represent the design HDL files with embedded instrumentation entities that have been re-compiled in the current compilation cycle.

When instrumentation load tool 464 locates a proto data structure 463 with the special marker, the corresponding VHDL source code file for the design entity is opened and parsed to locate the one or more embedded instrumentation entity comments. For each of these comments, instrumentation load tool 464 creates a specially named proto data structure 463a, and further generates a corresponding instance data structure 465a that is instantiated within the design entity. In addition, instrumentation load tool 464 removes the special marker inserted by HDL compiler 462 to prevent unnecessary re-instrumentation of the design proto on subsequent re-compiles.

Within these created embedded instrumentation entity protos, instrumentation load tool 464 directly creates the necessary instrumentation logic required by the embedded instrumentation entity without the need for a VHDL file to specify this instrumentation and connects this logic to instrumentation logic block 420 of FIG. 4D. The updated design proto along with the embedded instrumentation entity proto and instance data structure are saved to disk and serve as inputs to subsequent compiles, removing the need to produce embedded instrumentation entities on subsequent recompiles.

Figure 9:
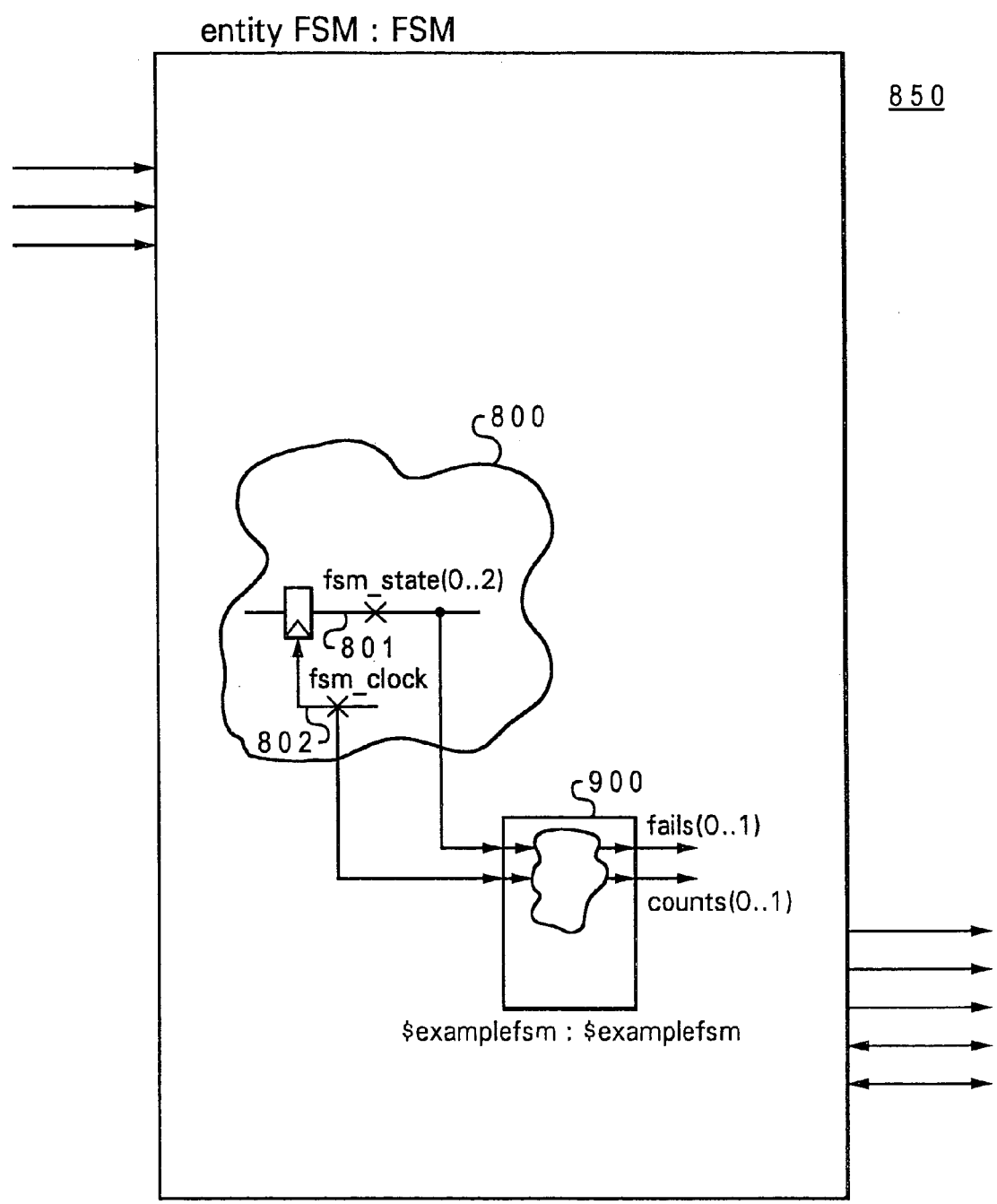
FIG. 9 depicts a hardware description language design entity included embedded instrumentation in accordance with a preferred embodiment of the present invention.

With reference now to FIG. 9, design entity 850 is shown instrumented with embedded instrumentation entity 900 in accordance with a preferred embodiment of the present invention. Embedded instrumentation entity 900 is created as a proto instantiated within design entity 850 wherein the embedded non-conventional instrumentation entity comment occurs. The embedded instrumentation entity thus may be replicated automatically within an overall design wherever the specific design entity is instantiated.

Embedded instrumentation entity 900 is named in a unique manner based on the name associated with the embedded instrumentation entity by the prologue and embedded instrumentation name declaration comment. This name is pre-pended with a special character (shown as a "$" in FIG. 9) that is not a recognized naming convention for the platform HDL. In this manner, the names of the embedded instrumentation entities cannot conflict with the names of any other design or standard instrumentation entities.

Furthermore, the names associated with the various events defined by the embedded instrumentation entity (the "varname" for the count events, for example) are also derived in a fixed manner from the name associated with the embedded instrumentation entity. The user is required to ensure that the names of embedded instrumentation entity events do not conflict with the names of standard instrumentation entity events and further than the names of the embedded instrumentation entities within a given design do not themselves conflict.

It should also be noted that if a design entity contains more than one embedded instrumentation entity, the embedding process described with reference to FIG. 8B and FIG. 9 is simply repeated for each such instrumentation entity. In addition, since the protos for the embedded instrumentation entities are created at the same time as the design protos itself, no changes to the BOM mechanism used for incremental compiles are required. The protos for the embedded instrumentation entities can be considered, for purposes of incremental compilations, to be mere extensions to the design proto itself.

The present invention discloses a method and system for naming events within a simulation model that prevents name collisions between events in different instrumentation entities, allows for the arbitrary re-use of components of a model in models of arbitrarily increasing size, and furthermore allows for processing designated events in a hierarchical or non-hierarchical manner.

When all instances of an event are considered as a whole without regard to specific instances, the event is considered in a "non-hierarchical" sense. Likewise, when an event is considered with regard to each and every instance, it is considered in a "hierarchical" sense. When considering count events, for example, it is often convenient to track the number of times a particular count event occurred in the aggregate without concern to exactly how many times the count event occurred in each particular instance within a simulation model.

Each type of event: count, fail, and harvest, is given a separate event namespace by construction. Each event class is therefore an independent group preventing naming collisions between the event types. The data structure of the present invention is independently applied to each of the different event types to ensure correctness within each event class.

In the embodiments illustrated in FIGS. 10A, 10B, 10C, and 10D, the system and method of the present invention are described with respect to count events. One skilled in the art will appreciate and understand the extensions necessary to apply the same techniques to other event classes such as failures or harvests.

Figure 10A:
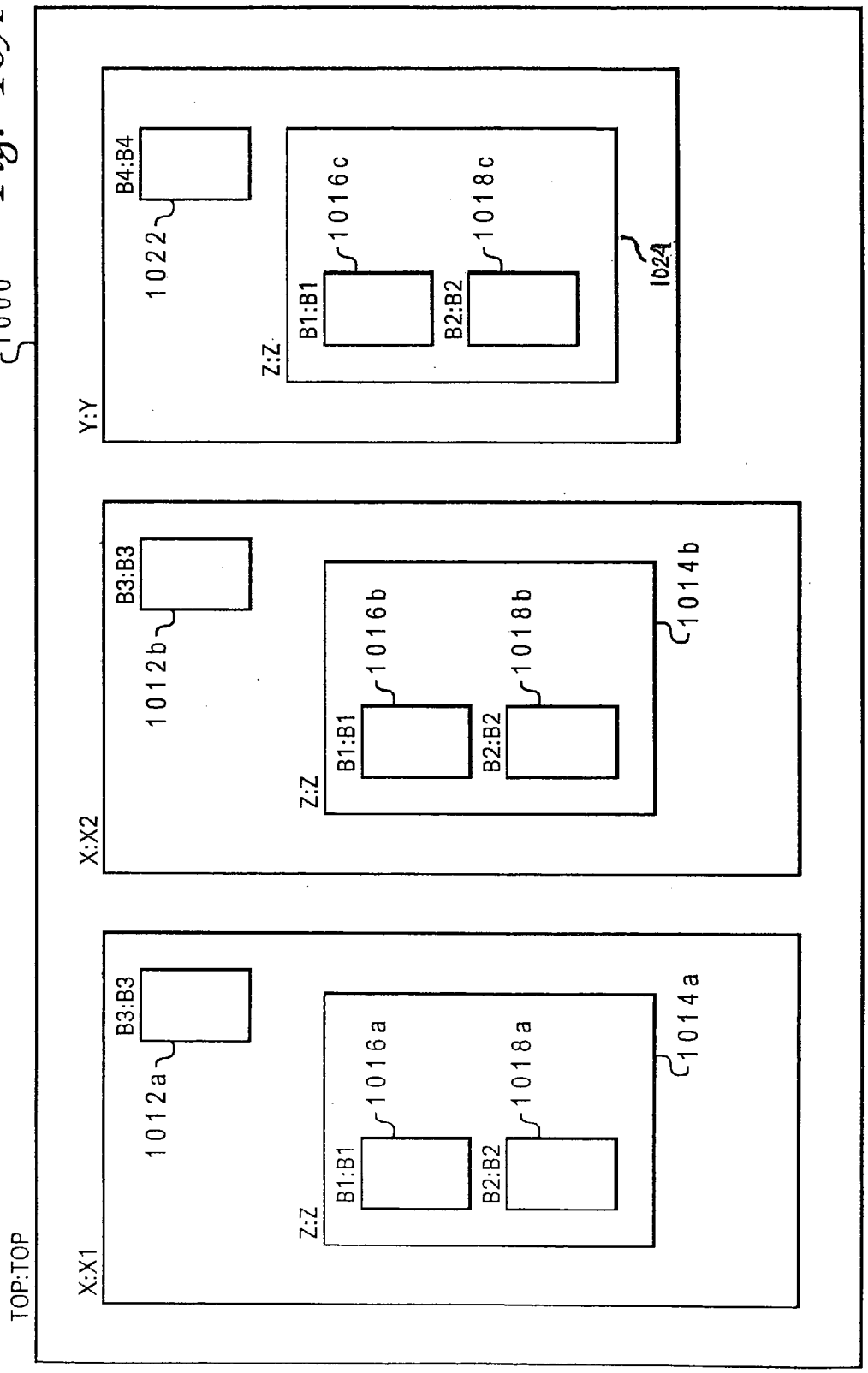
FIG. 10A is a block diagram illustrating a simulation model containing a number of design and instrumentation entities.

With reference to FIG. 10A, there is depicted a block diagram representation of simulation model 1000 containing a number of design and instrumentation entities. As illustrated in FIG. 10A, simulation model 1000 includes two instances of a design entity X, with instance names X1 and X2 respectively.

Within each of design entity instances X1 and X2 is instantiated an instance of an instrumentation entity B3, 1012a and 1012b. Design entity instances X1 and X2 further comprise instances, 1014a and 1014b, respectively, of design entity Z which further contains instances, 1016a and 1016b, of instrumentation entity B1 and instances, 1018a and 1018b, of instrumentation entity B2.

Finally, simulation model 1000 includes an instance of design entity Y, with instance name Y, containing an instance of instrumentation entity B4 1022. Design entity instance Y contains an instance, 1024, of design entity Z with further instances, 1016c and 1018c, of instrumentation entities B1 and B2 respectively.

In what follows the methods of the present invention for uniquely naming events will be considered in the context of exemplary model 1000. It will be assumed in the following description that each instrumentation entity (B1, B2, B3, and B4) has declared a single count event with event name "count1".

In accordance with the method and system of the present invention, the user must uniquely name each type of event (count, fail, or harvest) within a specific instrumentation entity, i.e., the user cannot declare any two events of the same type within the same instrumentation entity with the same event name. Such a constraint does not conflict with the stated goals of the present invention in that a given instrumentation entity is usually created by a specific person at a specific point in time, and maintaining unique names within such a limited circumstance presents only a moderate burden to the user. The data structure disclosed herein does, however, prevent all name collisions between events in different instrumentation entities, and allows for processing the events in a hierarchical and/or non-hierarchical manner.

As previously explained, an HDL naming convention must uniquely identify all the entities within a given design. This constraint is inherent to HDLs and applies to design entities as well as instrumentation entities. In accordance with conventional VHDL entity naming constructs, it is technically possible for two design entities to share the same entity name, entity_name. However, such identically named entities must be encapsulated within a VHDL library from which a valid VHDL model may be constructed. In such a circumstance, entity_name, as it is utilized herein, is equivalent to the VHDL library name concatenated by a period (".") to the entity name as declared in the entity declaration.

Pre-pending a distinct VHDL library name to the entity name disambiguates entities sharing the same entity name. Most HDLs include a mechanism such as this for uniquely naming each design entity. Design entities must be unambiguously named in order to determine which particular entity is called for in any given instance in a simulation model. The present invention employs the prevailing naming mechanism of the native HDL to assign unique entity names for design entities throughout a given model.

The present invention leverages this uniqueness property of entity names and the uniqueness of each instance's instantiation identifier to create an "extended event identifier" for each event within the simulation model.

With reference to FIG. 10B, there is illustrated a representation of the fields in an extended event identifier data structure in accordance with one embodiment of the present invention. The extended event identifier begins with instantiation identifier field 1030. This field, as described hereinbefore, consists of the instance identifiers, proceeding from the top level entity to the direct ancestor of the given instance within the simulation model separated by periods (".") This string is unique for each and every instance of the event within the model. The extended event identifier further includes an instrumentation entity field 1032, a design entity field 1034, and an eventname field 1036.

Instrumentation entity field 1032 contains the name of the instrumentation entity (or the name assigned to an embedded instrumentation entity) that generates the simulation event. Design entity field 1034 contains the entity name of the design entity in which the event occurs. Eventname field 1036 is the name given to the event in the instrumentation entity description comments of an instrumentation entity or the event name assigned to an event within an embedded instrumentation entity. These four namespace fields comprise a unique identifier for each event within a simulation model that allows for the re-use of components within other models without risk of name collisions and the consideration of events in a hierarchical or non-hierarchical sense.

With reference now to FIG. 10C, there is shown a list of extended event identifiers for model 1000. Event identifiers 1040, 1041, 1042, 1043, 1044, 1045, 1046, 1047, and 1048 are declared within simulation model 1000 to designate count events having eventname "count1". The extended event identification procedure of the present invention will be described in the context of these extended event identifiers.

The uniqueness of the names in design entity name field 1034 is a primary distinguishing factor between events. By including the design entity name in the extended event identifier, each design entity is, in effect, given a unique namespace for the events associated with that design entity, i.e., events within a given design entity cannot have name collisions with events associated with other design entities.

It is still possible, however, to have name collisions between events defined by different instrumentation entities that are incorporated within a single design entity. Events 1041 and 1042, for example, if identified solely by the design entity name, have a name collision. Both are events with eventname "count1" within design entity Z, and if labeled as such, are indistinguishable. In order to alleviate a naming collision between events 1041 and 1042, the present invention employs instrumentation entity field 1032. By referencing the design entity and instrumentation entity names, both of which are unique with respect to themselves and each other, a unique event namespace is created for each instrumentation entity associated with any given design entity. For example, event identifier 1041 and 1042 would be in conflict (both named Z.count1), unless the respective instrumentation entity names are included within the extended event identifier to produce names B1.Z.count1 and B2.Z.count2 for these events.

It should be noted that it is possible to uniquely name each event by using instrumentation entity name field 1032 alone. Due to the uniqueness property of instrumentation entity names, event names that are only named by the instrumentation entity name and the event name field will be necessarily unique.

However, such a naming scheme is insufficient for associating events with a given design entity. In practice, it is desirable to associate events with the design entity in which they occur rather than associating them with the potentially numerous instrumentation entities that are utilized to track them. Moreover, referencing the appropriate design entity within the eventname allows all the events associated with a given design entity to be centrally referenced without the need to ascertain the names of all the instrumentation entities associated with the given design entity. The data structure of the present invention utilizes both the instrumentation entity and design entity names in naming events for ease of reference at the cost of moderate uniqueness redundancy in the event names.

In an alternative embodiment of the present invention, the instrumentation entity name is not included within the extended event identifier. Referring to FIG. 10D, such an alternative extended event identification data structure is depicted. As shown in FIG. 10D, events are named by instantiation identifier field 1030, design entity name field 1034, and event name field 1036.

Such a data structure provides name collision protection between design entities but not within design entities. That is, the user must ensure that events names for events associated with a given design entity do not collide. In case of user error in this regard, model build tools may be utilized to detect an event name collision condition during model compilation. The alternative data structure depicted in FIG. 10D provides for simpler naming and referencing of events at the expense of requiring the user to prevent name collisions for events associated with a given design entity.

Returning to FIG. 10B, the combination of instrumentation entity field 1032, design entity name field 1034, and eventname field 1036 for a given event, provides a unique identifier for any given event without regard to multiple instantiations of the event. In order to uniquely distinguish between multiple instantiations of an event, instantiation identifier field 1030 is included in the extended event identifier. Instantiation identifier field 1030 field, by its construction, provides a unique string for any instance of an entity within any simulation model.

When evaluating occurrences of an event in a non-hierarchical sense, instantiation identifier field 1030 is ignored while searching for matching events. As illustrated in FIG. 10C, for example, a non-hierarchical query for the number of time a "count1" event occurs within design entity Z as detected by instrumentation entity B1, utilizes the following list of count eventnames:

| X1.Z | B1 | Z | COUNT1 |
| X2.Z | B1 | Z | COUNT1 |
| Y.Z  | B1 | Z | COUNT1. |

These count events are added together to form an aggregate count of the total number of time the specific event occurred within the simulation model.

A hierarchical query includes specific criteria to match against the hierarchy field to limit the counter or counters found to specific instances of the requested event. For example, a query to obtain the count1 event of instrumentation entity B1 within the X1.Z instance of design entity Z utilizes the following count eventname:

| X1.Z | B1 | Z | COUNT1, | which represents the number of times the count1 event was counted by instrumentation entity B1 within design entity instance X1.Z for a particular simulation interval.

By providing matching model hierarchy criteria against instantiation identifier field 1030, it is possible to consider the events with respect to their particular instance or instances within the model, i.e., a hierarchical query. A non-hierarchical query merely ignores the hierarchy field and returns all the instances of the requested events within the model.

Figure 11A:
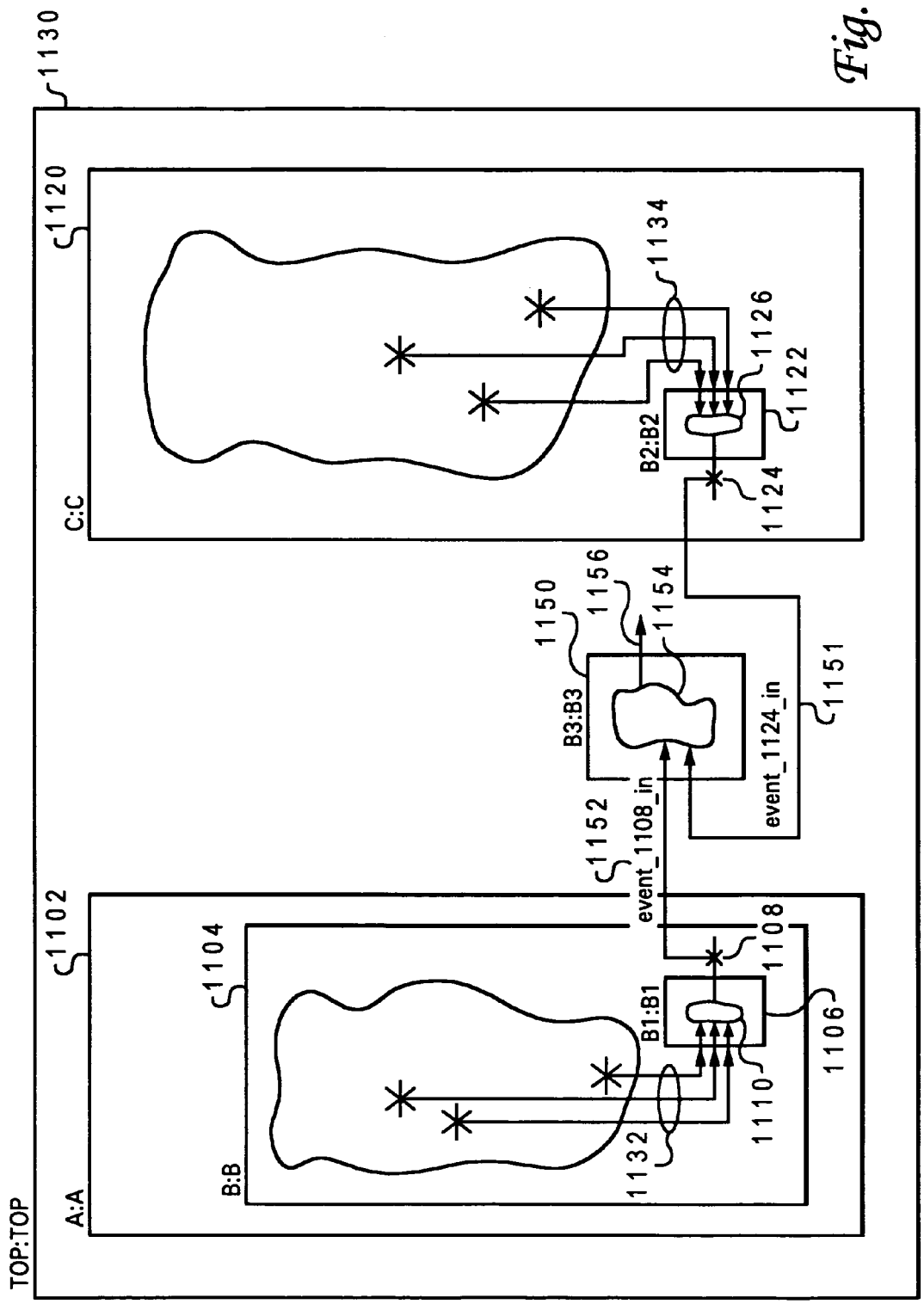
FIG. 11A is a block diagram illustrating a simulation model in which the hierarchical event processing of the present invention is applicable.

With reference to FIG. 11A, there is depicted a block diagram illustrating a simulation model 1100 in which the hierarchical event processing of the present invention is applicable. Simulation model 1100 comprises a top-level design entity 1130 in which a pair of lower-level design entities 1102 and 1120 are instantiated. A design entity 1104 containing instrumentation entity 1106 is included within design entity 1102. As illustrated in FIG. 11A, instrumentation entity 1106 includes logic 1110 for generating a simulation event 1108 from signal set 1132 from within design entity 1104. Design entity 1120 includes an instrumentation entity 1122 that generates a simulation event 1124 using signal set 1134.

Utilizing the techniques described hereinbefore, generating a hierarchical event that is some logical combination of events 1108 and 1124 requires the creation of an instrumentation entity associated with top level design entity 1130 that references signal sets 1132 and 1134. Conventionally, such an instrumentation entity would substantially reproduce instrumentation logic 1110 and 1126 to process signal sets 1132 and 1134, respectively, thus producing a copy of events 1108 and 1124. Such a procedure is inefficient and prone to error. If, for example, changes are made to any or all of signal sets 1132 and 1134, or instrumentation logic 1110 and 1126, these changes would have to be accurately repeated in the instrumentation entity logic for the combined event.

The present invention provides a mechanism whereby events, such as events 1108 and 1124, are directly referenced and utilized as inputs to cross-hierarchical instrumentation entities. In this manner, signal connections 1132 and 1134, as well as instrumentation logic 1110 and 1126, are directly re-utilized to produce the desired hierarchical event.

To facilitate direct referencing of events within simulation models, a specialized data structure is implemented within instrumentation entity input port map comment syntax. In accordance with a preferred embodiment of the present invention, this data structure directly connects input ports of instrumentation entities to cross-hierarchical events within a simulation model.

For the embodiment depicted in FIG. 11A, an instrumentation entity 1150 is instantiated within top-level design entity 1130 to generate a hierarchical event 1156 that is some function of events 1108 and 1124. As illustrated in FIG. 11A, instrumentation entity 1150 includes a pair of inputs 1151 and 1152 that are directly connected to events 1124 and 1108, respectively, utilizing the augmented syntax described below. These input connections are logically combined using instrumentation logic 1154 to produce a cross-hierarchical event 1156.

With reference to FIG. 11B, there is depicted a set of input port mapping comments for performing cross-hierarchical processing of simulation model events in accordance with the teachings of the present invention. In what follows, it is assumed that events 1108 and 1124 are count events with event names event_1108 and event_1124, respectively, and that these events are connected to input ports event_1108_in and event_1124_in on instrumentation entity 1150. As depicted in FIG. 11B, a first input port mapping comment 1161 contains data for referencing event 1108 to input port event_1108_in. A second input port mapping comment 1162 contains data for referencing event 1124 to input port event_1124_in. It should be noted that each of input port mapping comments 1161 and 1162 includes a pre-pended non-conventional comment identifier, --!!, that is utilized by the HDL compiler (such as compiler 462 in FIG. 4D) to maintain the port mapping comments separate from the design.

To facilitate connection of a simulation event to an instrumentation entity input port, input port mapping comments 1161 and 1162 consist of two distinct parts: an instance identifier and an event identifier. The instance identifier is a string consisting of instance names (in descending hierarchical order) of all design entities between and including the design entity containing the instrumentation entity of the cross-hierarchical event being defined (i.e., the highest level design entity for the cross-hierarchical event), and the design entity in which the event that is utilized in generating the cross-hierarchical event. If the design entity containing the hierarchical event is the same as the design entity containing the event to be connected to, the instance identifier is a null string. A pair of instance identifiers 1163 and 1164, within input port mapping comments 1161 and 1162, respectively, specify that events 1124 and 1108 originate from signals within design entity 1120 and 1104 respectively.

Input port mapping comments 1161 and 1162 further include event identifiers 1165 and 1166, that identify input simulation events in terms of local instrumentation entities 1106 and 1122, respectively. In accordance with the embodiment depicted in FIG. 11B, each event identifier consists of a string beginning with an open bracket ("[") character and ending with a closed bracket ("]") character. Between these brackets, three sub-strings, delineated by period (".") characters, comprise a data structure utilized to identify a specific event from which the cross-hierarchical event is defined. The first sub-string within an event identifier is the instance name of the instrumentation entity containing the event. The second sub-string is a string specifying the type of the event ("count", "fail", or "harvest"). Finally, the third sub-string is the event name of the given event as specified in the declaration comment for the event. Each event identifier string uniquely identifies a single event within a given design entity. As depicted in FIG. 11B, event identifier strings 1165 and 1166 identify events 1108 and 1124 respectively.

In accordance with an alternate embodiment of the present invention, the event identifier naming structure is modified slightly for events that are labeled in accordance with FIG. 10D (event names that do not include the instrumentation entity name). When an instrumentation identifier is absent from the extended event identifier, the event identifier string with an input port mapping comment consists of two sub-strings: a string denoting the type of event to connect to; and a string providing the name of the event separated by a period (".") character. The instrumentation entity name is not required in this case since all events of a given type associated with a given design entity will have unique names. The model build tools of the present invention will automatically search all instrumentation entities associated with the design entity called out by the instance identifier to determine which instrumentation entity generates an event having the name and type provided in the event identifier string.

Referring to FIG. 11C, there is illustrated a set of data structures for performing hierarchical processing of simulation model events in accordance with a second embodiment of the present invention. In the depicted embodiment, a pair of input port mapping comments 1171 and 1172 employ a syntax compatible with the event naming data structure depicted in FIG. 10D.

Input port mapping comment 1171 connects event 1108 to input port event_1108_in on instrumentation entity 1150. Likewise, input port mapping comment 1172 connects event 1124 to input port event_1124_in on instrumentation entity 1150. By utilizing the augmented syntax of FIG. 11B or FIG. 11C it is possible to create hierarchical events by connecting the inputs of instrumentation entities to events within the simulation model.

The above described system and method provides for practical instrumentation of simulation models and allows for efficient implementation of instrumentation logic through embedded instrumentation entities. Embedded instrumentation entities, as described hereinabove, are however necessarily limited to task-specific implementations. As described with reference to FIGS. 12A and 12B, the present invention further provides for a more flexible implementation of instrumentation logic in a more unstructured manner.

Figure 12A:
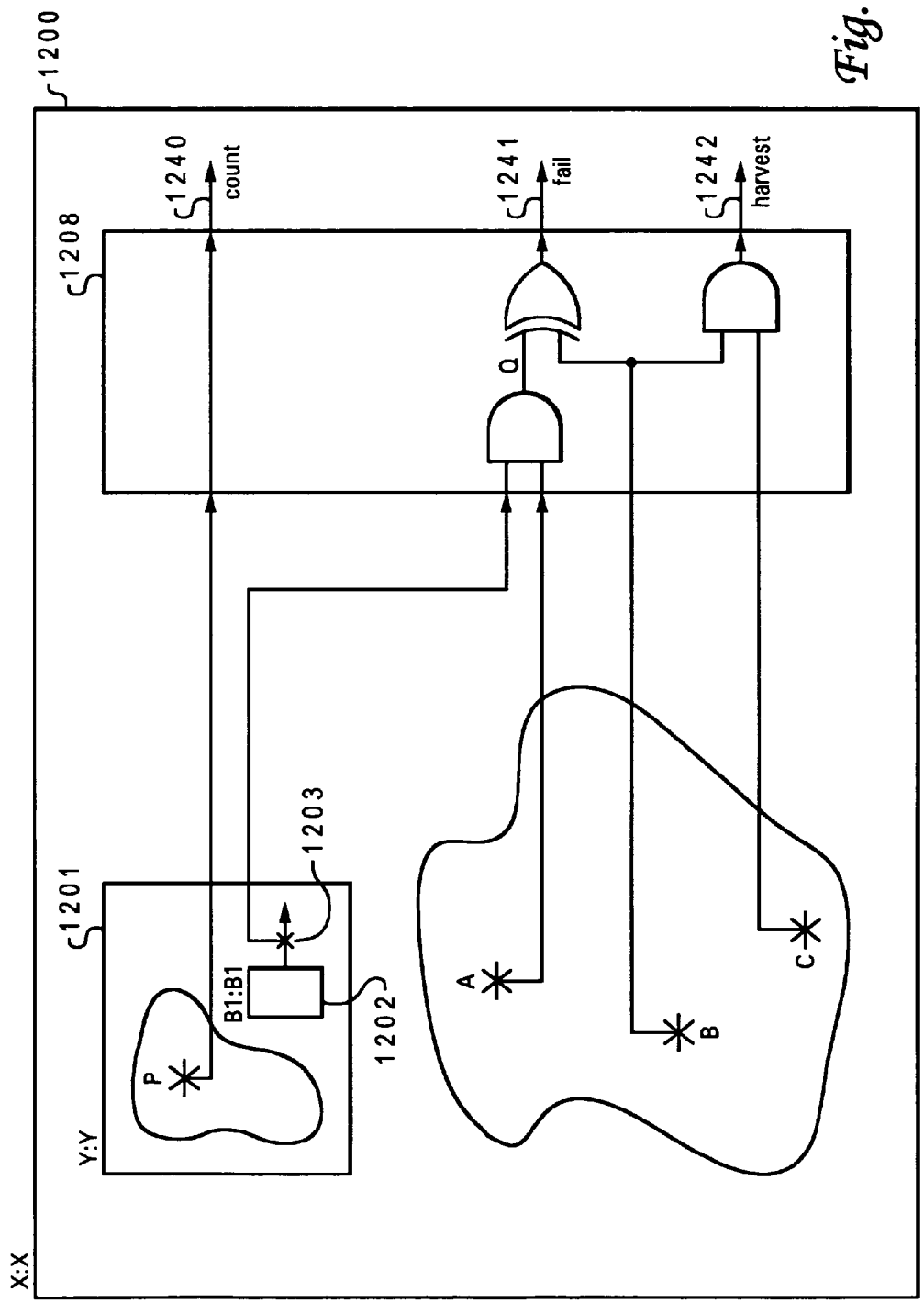
FIG. 12A depicts a representative target design entity with an instrumentation entity containing random instrumentation logic implemented in accordance with a preferred embodiment of the present invention.

It is often necessary to tailor instrumentation logic to address unique problems and circumstances. Instrumentation logic of a specific and yet non-predefined nature that is designed in accordance with the techniques disclosed herein with reference to FIGS. 12A and 12B is referred herein as "random instrumentation logic." A data construct consisting of general logic primitives (boolean operators, storage elements, etc.) and an interconnection method for these primitives is utilized for implementing such random instrumentation logic.

For instrumenting a simulation model as described heretofore, an HDL such as VHDL or Verilog is utilized as a platform from which instrumentation logic is generated. Appropriate instrumentation entity descriptor comments within design entity source code files couple the resultant instrumentation entities to designated target design entities within a simulation model.

In addition to entity descriptor comments within a design entity source code file, the foregoing instrumentation technique requires a separate HDL file in which the instrumentation entity is described. As explained with reference to FIGS. 12A and 12B, the present invention provides a method, system, and data structure for instrumenting design entities within a simulation model while avoiding the design process overhead required for creating a separate instrumentation entity HDL file.

In accordance with the teachings of the present invention, random instrumentation logic is directly deployed within target design entities in terms of individualized and customizable instrumentation descriptor comments. Such instrumentation descriptor comments are encoded within the target design entity HDL source code file and provide a means for the describing random instrumentation logic, events, and interconnections between the created instrumentation logic and the target design entity. The random instrumentation logic is inserted into the simulation model in a manner similar to the techniques used for embedded instrumentation entities to produce an instrumentation entity without the need for the creation of an explicit HDL instrumentation entity file.

With reference to FIG. 12A, there is illustrated a representative target design entity 1200 wherein random instrumentation logic is implemented in accordance with a preferred embodiment of the present invention. Instantiated within target design entity 1200 is a design entity 1201. As further depicted in FIG. 12A, an instrumentation entity 1202 is instantiated within design entity 1201. Instrumentation entity 1202 is designed in accordance with the principles set forth hereinabove to generate a count event 1203 having an event name "count1." Target design entity 1200 further includes an instrumentation entity 1208 that is generated utilizing random instrumentation logic in accordance with a preferred embodiment of the present invention. As depicted in FIG. 12A, instrumentation entity 1208 receives as inputs signals P, A, B, and C along with count event 1203.

Instrumentation entity 1208 is constructed by a set of unconventional comments lines within the source code file for target design entity 1200. These comments may be incorporated at any point within the logic description section of the HDL source code file. HDL compiler 462 (FIG. 4B) recognizes the unconventional comments in addition to any comments utilized to instantiate embedded instrumentation entities within design entity 1200. During the post-compilation/model build phase, instrumentation load tool 464 processes these comments in a manner similar to that utilized for embedded instrumentation entities (described with reference to FIGS. 10A–10D) to generate instrumentation entity 1208.

A variety of possible syntaxes can be utilized to formulate the unconventional HDL comments required for generating random instrumentation logic within the source code file of a target design entity. As depicted in FIG. 12B, much of the syntax of these comments employs syntax similar to the concurrent subset of the VHDL language with the addition of syntactic and semantic enhancements that provide a means of connection between an instrumentation entity and its target design entity. In addition, minor syntactic and semantic enhancements are provided to declare events and intermediate signals.

With reference now to FIG. 12B, there is illustrated an exemplary HDL source code file 1220 that describes design entity 1200. Within HDL source code file 1220, an entity instantiation 1221 produces design entity 1201, and assignment statements 1222 are utilized to generate signals A, B, and C. A set of unconventional comments 1223 within HDL source code file 1220 is utilized to produce instrumentation entity 1208. Comments 1223 are formulated as left-hand side (l.h.s.)/right-hand side (r.h.s.) assignment statements of the form:

$$\{l.h.s.\} <= \{r.h.s.\};$$

where {l.h.s.}, referred to herein after as lhs, is the assignment statement target and, {r.h.s}, referred to herein after as rhs is an expression denoting the logical value to be assigned to the statement lhs. A number of rules delineate the possible expressions for lhs and rhs in any legal statement in the instrumentation comments.

As employed within the instrumentation data structure of the present invention, an lhs statement may be either an event declaration or the name of a signal that is instantiated within an instrumentation entity. An event declaration is an expression within bracket characters ("[", "]") that generates a new event. Within comments 1223, a statement 1230 produces a count event 1240 from instrumentation entity 1208 (FIG. 12A) having eventname "countname0".

Within an lhs event declaration, a first field designates the event type (count, fail, harvest, etc.) and is followed by such other fields as are necessary to declare the event. As illustrated in lines 1230, 1234, and 1236, such event declaration fields follow the same format as the event declaration fields depicted in FIG. 4C.

Comments 1223 further include a line 1232 having an lhs that declares a signal Q within instrumentation entity 1208. To prevent ambiguity, any signal declared in this manner may not have a name corresponding to the name of any signal present on the top level of target design entity 1200. Conformance to this requirement is verified by instrumentation load tool 464 (FIG. 4D) during processing. Signals declared by an lhs expression may be incorporated within an rhs expression as shown in lines 1232 and 1234.

An rhs consists of logical connectivity expressions and/or functions that combine various signals. Signals within these connectivity expressions may originate from a number of possible sources including: signals declared on the lhs of a statement in the instrumentation comments; signals within the target design entity; or signals designating other events within the target design entity.

The absence of period (".") or bracket ("[", "]") characters within a signal value description in the rhs of a statement, designates the object signal as corresponding to either a signal within the top hierarchical level of the target design entity or to a signal declared on the lhs of a statement within the instrumentation language. Signals are named in a mutually exclusive manner by the rules governing creation of signals on the lhs of a statement in the instrumentation comments, thereby preventing any ambiguity in the determining the source of the given signal.

Signals in rhs connectivity expressions can also be connections to signals within entities instantiated within the target design entity. In such a circumstance, the instance names of the entity or entities in the hierarchy enclosing the desired signal are placed before the signal name in hierarchy order, delineated by period (".") characters. For example, the signal in statement 1230 ("Y.P") represents a signal within design entity 1201. Signals at any level of the target design hierarchy are thus accessible to instrumentation logic generated by the instrumentation language comments.

Signals within the instrumentation comment expressions can also designate other events within the target entity. Event identifiers as described hereinbefore for hierarchical events are used to denote such "event" signals. For example, statement 1232 performs a logical AND of instrumentation event 1203 and signal A. The event identifier "Y.[B1.count.count1]" connects instrumentation entity 1208 to instrumentation event 1203. This notation permits instrumentation events at any level of design hierarchy within target design entity 1200 to be directly accessed.

As further depicted in FIG. 12B, statement 1232 produces intermediate signal Q within instrumentation entity 1208. This is an example of an instrumentation comment statement declaring a new intermediate signal. These signals can be used in other statements to construct random instrumentation logic of any desired depth or complexity.

Statement 1234 utilizes intermediate signal Q along with signal B to produce fail event 1241. The syntax for fail event declaration includes a field denoting the type of event ("fail"), a field giving the event name for the fail event ("failname0"), and a final field denoting the message to associate with the fail. Finally, statement 1236 produces harvest event 1242.

In general, the rhs expression of any statement in the instrumentation data structure of the present invention can access any signal or instrumentation event signal within the target design entity utilizing these syntactic mechanisms. These signals can be combined to form new events or intermediate signals that can themselves be further combined to form instrumentation logic of any desired depth or complexity.

Instrumentation comments can be placed anywhere within the logic description section of the target entity source code file. All instrumentation comments within a file are considered as a whole and produce a single instrumentation entity within the target design entity.

It is often necessary to override signal values within a simulation model to test various functions and create certain conditions that would otherwise not be possible or simple to obtain. To provide an efficient and designer accessible means of overriding signal values within a simulation model, the present invention incorporates specialized signal override output ports and logic into instrumentation entities that permit bus signal overrides during model simulation. Such signal override output ports must have different names that the outputs for count, fail, and harvest events, and compliance with this condition is verified by instrumentation load tool 464 (FIG. 4D) during the model build process.

The signal override output ports may be declared explicitly as ports in the HDL source code file of an explicitly represented instrumentation entity. For an embedded instrumentation entity or instrumentation entities produced by random instrumentation logic comments within a target design entity, the signal override output ports are automatically generated by instrumentation load tool 464. The signal override output ports are described in output port map statements that declare an alternate value that overrides a given simulation signal. Such an output port map statement further declares the conditions under which the simulation signal will be overridden. For each simulation signal (single or multi-bit) to be overridden, two output signals are produced: one providing the override signal value and another in the form of a single bit signal that enables or disables overriding of the simulation signal.

Figure 13A:
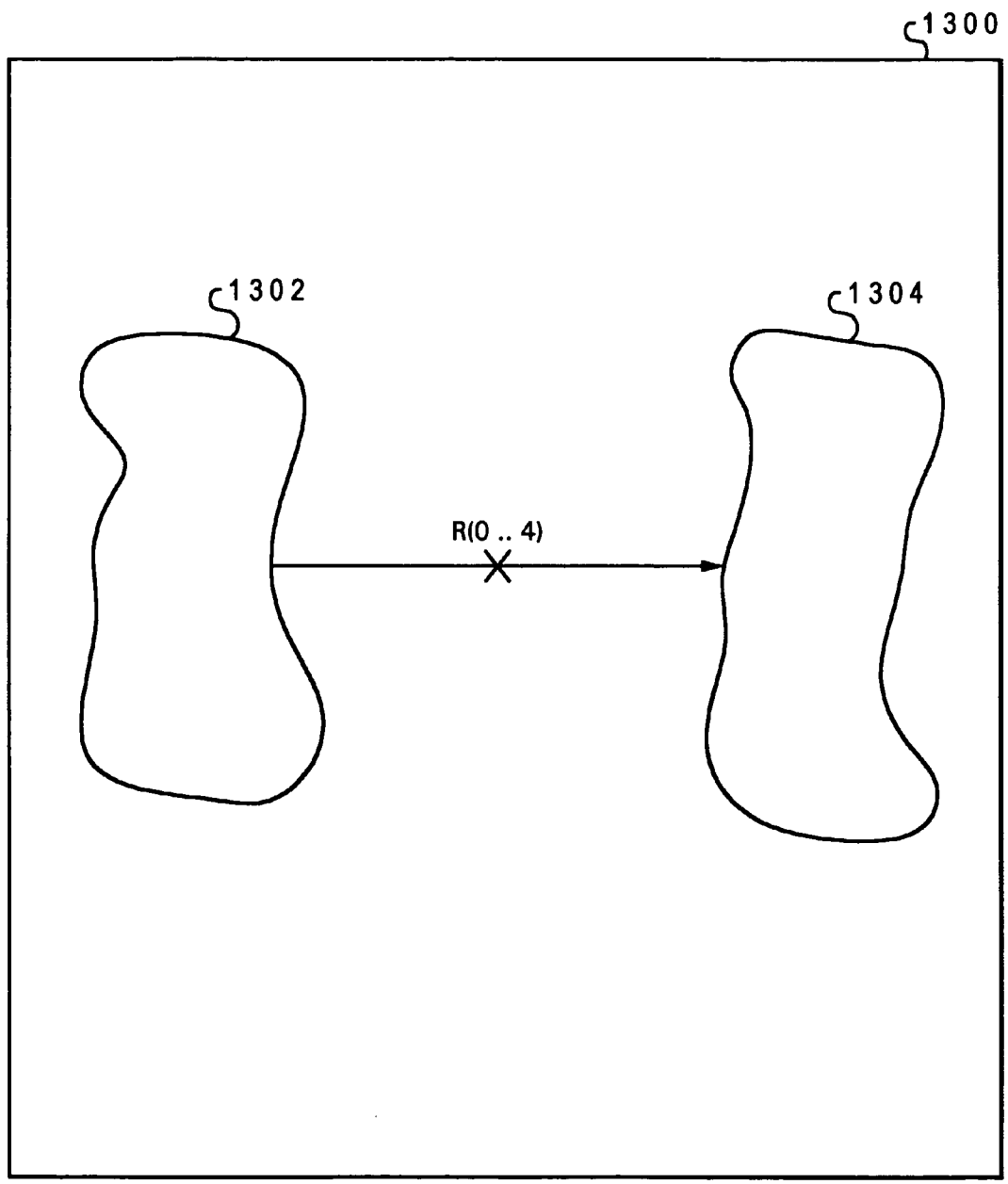
FIG. 13A depicts an exemplary design entity containing a multi-bit simulation signal.

With reference to FIG. 13A, there is depicted an exemplary HDL design entity 1300 containing a multi-bit simulation signal R. Simulation signal R is driven by one or more sources within a logic module 1302, and is received by one or more sinks within a logic module 1304. While the present invention will be described with respect to overriding signal R, one skilled in the art will understand and appreciate the extensions necessary to apply the principles set forth herein to overriding single bit signals or subsets of multi-bit signals.

Figure 13B:
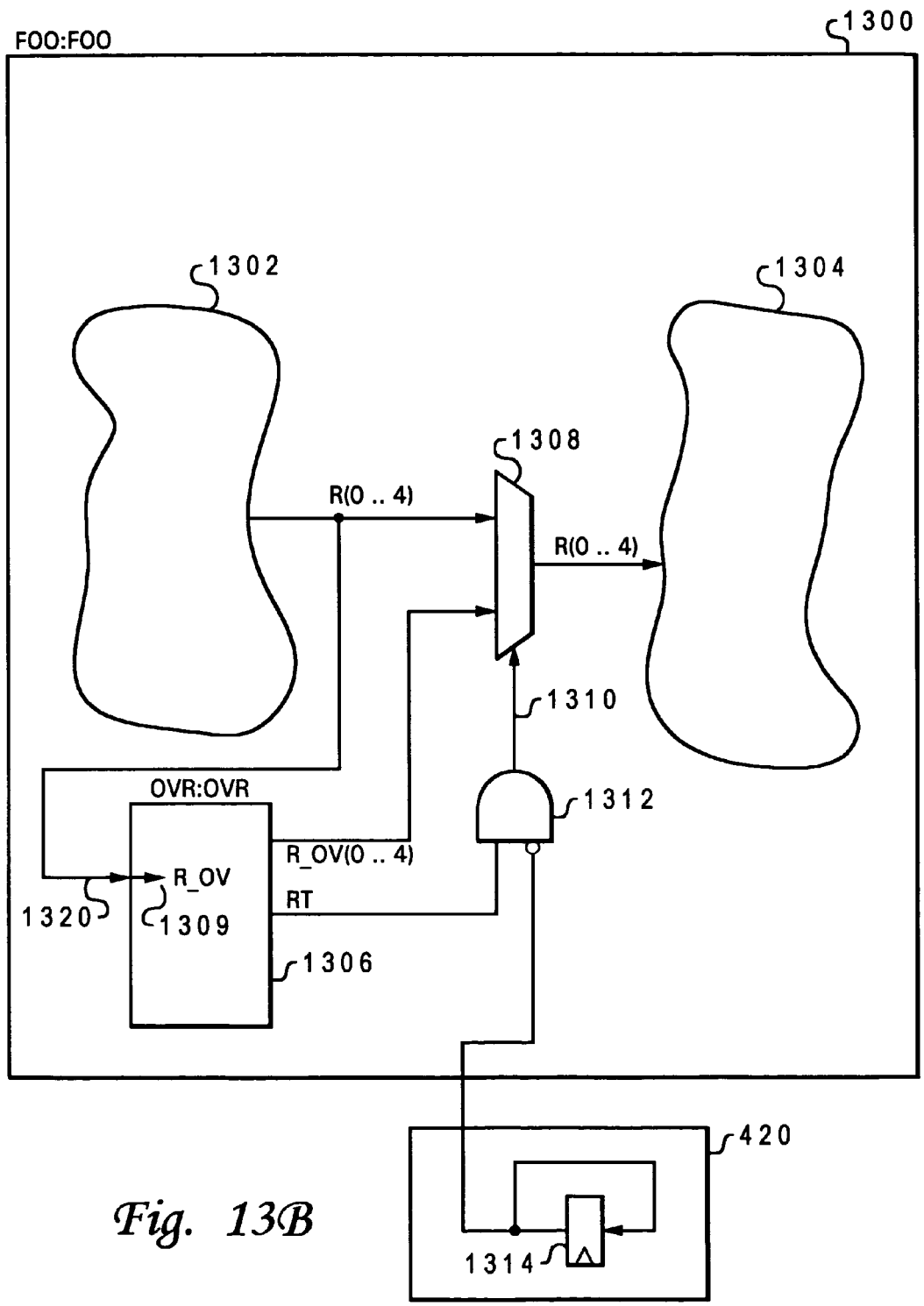
FIG. 13B illustrates a design entity wherein signal injection is implemented in accordance with a preferred embodiment of the present invention.

Referring to FIG. 13B, signal override functionality is incorporated within design entity 1300 in accordance with a preferred embodiment of the present invention. As illustrated in FIG. 13B, design entity 1300 includes an instrumentation entity 1306 that is equipped to override signal R. In the depicted embodiment, instrumentation entity 1306 produces a signal R_OV(0 . . . 4) that is utilized within HDL design entity 1300 to selectively replace signal R as an input into logic module 1304. Instrumentation entity 1306 further produces a signal RT that enables an override of signal R with signal R_OV(0 . . . 4).

During a model build process, instrumentation load tool 464, instantiates a multiplexor (MUX) 1308 that breaks the path of the original signal R as depicted in FIG. 13A to produce signal R' that is input into logic module 1304. MUX 1308 is directly instantiated by instrumentation load tool 464 into the design proto data structure for instrumentation entity 1306 without the need to alter the HDL source code for HDL design entity 1300. MUX 1308 selects between override signal R_OV(0 . . . 4) and the original signal value R to determine the value of signal R'.

MUX 1308 is controlled by a select signal 1310 that is driven by logical AND gate 1312. Logical AND gate 1312 is driven by signal RT and a latch bit signal from a latch 1314. In a manner similar to that described in relation fail events in FIG. 5A, latch 1314, when loaded with a binary '1' value, forces MUX 1308 to select the original signal value R, thereby disabling overrides of signal R.

Instrumentation load tool 464 generates latch 1314 and logical AND gate 1312 for every overriddable signal within the simulation model. All signal overrides within a model can thus be selectively and individually disabled. For each overriddable signal, latch 1314 resides within instrumentation logic block 420 as depicted in FIG. 4B. In accordance with a preferred embodiment, only one instrumentation entity may override a given single bit signal or any signal or subset of signals within a multi-bit signal.

The signal override system of the present invention further provides a means by which instrumentation entities may access the original unaltered version of any given signal within the simulation model. As depicted in FIG. 13B, for example, instrumentation entity 1306 accesses the unaltered signal R by means of input signal 1320.

With reference to FIG. 13C, there is illustrated an exemplary HDL source code file 1340 that describes instrumentation entity 1306 in accordance with a preferred embodiment of the present invention. HDL source code file 1340 includes entity descriptor comments 1351 and an architecture section 1358 comprising the functional logic within instrumentation entity 1306.

Within HDL source code file 1340, an input port map statement 1364 declares an input port 1309 at which instrumentation entity 1306 receives signal R from logic module 1302. A set of output port map statements 1362 and 1363 define the output ports from instrumentation entity 1306 for signals R_OV(0 . . . 4) and RT, respectively.

An input port map comment 1360 connects signal input 1320 to instrumentation entity 1306. Input port map comment 1360 employs an augmented syntax from that previously described for input port map comments. Signals that appear within brace ("{", "}") characters are defined to reference the original unaltered version of a signal within a particular target design entity. Hence the statement --!!R_IN(0 to 4)=>{R(0 to 4)} connects input port R_IN to signal R in the altered design proto data structure. The brace syntax may be used to enclose any signal within a port map comment or any signal referred to within a random instrumentation comment statement RHS. If a signal referenced within braces has no associated override mechanism in the model, the signal declaration within braces merely resolves to the unaltered signal itself.

An additional comment section, output declarations 1361, is further included within the descriptor comment syntax to declare signal overrides. Output declaration comment 1361 serves to generate the override logic shown in FIG. 13B and connect signals RT and R_OV(0 . . . 4) to the override logic. Output declarations such as output declaration comment 1361 are of the form:

--!!<name>: out_port=>target_signal [ctrl_port];

where name is a name associated with the specific signal override (R_OVRRIDE in FIG. 13C), out_port is the output port providing the override value for the signal, target_signal is the name of the signal to be overriden, and ctrl_port is the single bit output port that determines when the target signal is overridden.

One such output declaration is required for every overridable signal. Signals designated by out_port and ctrl_port must appear as outputs declared in the HDL port map for the entity. As it does for instrumentation entities, instrumentation load tool 464 parses the comments depicted in FIG. 13C and alters the proto data structures within the simulation model at model build time to produce a result such as that depicted in FIG. 13B.

Furthermore, each signal override is given a unique name based on the "name" field within the output declaration comment in a manner analogous to that described earlier for count events. In this manner, each signal override can be specifically referred to for such purposes as disabling the signal override by setting latch 1314 as shown in FIG. 13B.

While FIG. 13C illustrates only those constructs necessary for implementing a signal override, it should be noted that there is no limitation placed upon the creation of count, fail, and harvest events within the same instrumentation entity as a signal override, and furthermore, that multiple signal override entities may be incorporated within the same instrumentation entity.

Referring to FIG. 13D, there is depicted an HDL source code file for producing design entity 1300 wherein a set of random instrumentation comments 1380 implement the logic necessary for selectively overriding signal R. A comment 1381 connects the unaltered version of signal R (referred to within the braces ("{", "}") syntax) to an internal instrumentation signal R_IN. A pair of comments 1382 and 1383 assign values for signals R_OV and RT (the exact expressions assigned to RT and R_OV are not depicted). An event declaration instrumentation comment 1384 produces a signal that enables signal R to be overridden.

In accordance with the depicted embodiment, an event declaration comment is of the form:

[override, <name>, <target_signal>, <ctrl_signal>]

where override is a fixed string denoting a signal override, "<name>" is the name assigned to the override, "<target_signal>" is the name of the signal in the target entity to be altered, and "<ctrl_signal>" is the name of the signal that determines when the signal override takes effect. By utilizing random instrumentation comments, a design engineer can efficiently create signal overrides.

Since, in accordance with the teachings of the present invention, signal overrides are implemented directly using hardware constructs, it is possible to efficiently utilize signal overrides within a hardware simulator.

While the invention has been particularly shown as described with reference to a preferred embodiment, it will be understood by those skilled in the art that various changes in form and detail may be made therein without departing from the spirit and scope of the invention. One of the embodiments of the invention can be implemented as sets of instructions resident in random access memory 28 of one or more computer systems configured generally as described in FIG. 1 and FIG. 2. Until required by computer system 10, the set of instructions may be stored in another computer readable storage device, such as disk drive 33 or in a removable storage device such as an optical disk for eventual use in a CD-ROM drive or a floppy disk for eventual use in a floppy disk drive. The set of instructions may be referred to as a computer program product. Further, the set of instructions can be stored in the memory of another computer and transmitted over a local area network or a wide area network, such as the Internet, when desired by the user. It is therefore contemplated that such modifications can be made without departing from the spirit or scope of the present invention as defined in the appended claims.

What is claimed is:

1. In a computer-aided design and verification system, a method for facilitating signal override in a simulation model of a digital circuit design that includes one or more design entities described utilizing a hardware description language (HDL), said method comprising:

instantiating an instrumentation entity within at least one of said one or more design entities using port mapping fields designated by a non-conventional HDL comment syntax, said non-conventional HDL comment syntax processed by a post-compiler instrumentation load tool to instantiate said instrumentation entity during a post-compile model build process, wherein said non-conventional HDL comment syntax is recognized by an HDL compiler such that the HDL compiler does not instantiate said instrumentation entity into the digital circuit design, said port mapping fields further including:

an input port mapping field containing data representing an input port at which said instrumentation entity receives a designated signal to be overridden; and an output port mapping field comprising an override signal field specifying a name of said override signal, a port name field specifying the name of a port from which said override signal is output from said instrumentation entity, and a target signal field specifying the name of said designated signal to be overridden;

generating signal selection means within said simulation model for selectively overriding said designated signal with said override signal responsive to said post-compiler instrumentation load tool processing said port mapping fields; and wherein said output port mapping field further comprises a control port field specifying an output port for delivering an override enable signal to said signal selection means.

2. The method of claim 1, further comprising;

instantiating a latch within said simulation model, wherein said latch stores an override disable bit; and combining said override disable bit with said ovexride enable signal within a logic gate to produce a combined selection signal that determines whether or not said signal selection means overrides said designated signal with said override signal.

3. In a computer-aided design and verification system, a system for facilitating signal override in a simulation model of a digital circuit design that includes one or more design entities described utilizing a hardware description language (HDL), said system comprising:

processing means for instantiating an instrumentation entity within at least one of said one or more design entities using port mapping fields designated by a non-conventional HDL comment syntax, said non-conventional HDL comment syntax processed by a post-compiler instrumentation load tool to instantiate said instrumentation entity during a post-compile model build process, wherein said non-conventional HDL comment syntax is recognized by an HDL compiler such that the HDL compiler does not instantiate said instrumentation entity into the digital circuit design, said port mapping fields further including:

an input port mapping field containing data representing an input port at which said instrumentation entity receives a designated signal to be overridden; and an output port mapping field comprising an override signal field specifying a name of said override signal, a port name field specifying the name of a port from which said override signal is output from said instrumentation entity, and a target signal field specifying the name of said designated signal to be overridden;

processing means for generating signal selection means within said simulation model for selectively overriding said designated signal with said override signal responsive to said post-compiler instrumentation load tool processing said port mapping fields; and wherein said output port mapping feild further comprises a control port specifying an output port for delivering an override enable signal, to said signal selection means.

4. The system of claim 3, further comprising:

processing means for instantiating a latch within said simulation model, wherein said latch stores an override disable bit; and processing means for combining said override disable bit with said override enable signal within a logic gate to produce a combined selection signal that determines whether or not said signal selection means overrides said designated signal with said override signal.

5. In a computer-aided design and verification system, a computer-readable medium having encoded thereon computer-executable instructions for facilitating signal override in a simulation model of a digital circuit design that includes one or more design entities described utilizing a hardware description language (HDL), said computer-executable instructions performing a method comprising:

instantiating an instrumentation entity within at least one of said one or more design entities using port mapping fields designated by a non-conventional HDL comment syntax, said non-conventional HDL comment syntax processed by a post-compiler instrumentation load tool to instantiate said instrumentation entity during a post-compile model build process, wherein said non-conventional HDL comment syntax is recognized by an HDL compiler such that the HDL compiler does not instantiate said instrumentation entity into the digital circuit design, said port mapping fields further including:

an input port mapping field containing data representing an input port at which said instrumentation entity receives a designated signal to be overridden; and
    an output port mapping field comprising an override signal field specifying a name of said override signal, a port name field specifying the name of a port from which said override signal is output from said instrumentation entity, and a target signal field specifying the name of said designated signal to be overridden;

generating signal selection means within said simulation model for selectively overriding said designated signal with said override signal responsive to said post-compiler instrumentation load tool processing said port mapping fields; and wherein said output port mapping field further comprises a control port field specifying an output port for delivering an override enable signal to said signal selection means.

6. The computer readable medium of claim 5, wherein said method further comprises:

instantiating a latch within said simulation model, wherein said latch stores an override disable bit; and
  combining said override disable bit with said override enable signal within a logic gate to produce a combined selection signal that determines whether or not said signal selection means overrides said designated signal with said override signal.

* * * * *